United States Patent
Noborio et al.

(10) Patent No.: US 11,233,147 B2
(45) Date of Patent: Jan. 25, 2022

(54) SEMICONDUCTOR DEVICE

(71) Applicant: DENSO CORPORATION, Kariya (JP)

(72) Inventors: Masato Noborio, Kariya (JP); Jun Saito, Toyota (JP); Yukihiko Watanabe, Nagakute (JP)

(73) Assignee: DENSO CORPORATION, Kariya (JP)

( * ) Notice: Subject to any disclaimer, the term of this patent is extended or adjusted under 35 U.S.C. 154(b) by 127 days.

(21) Appl. No.: 16/745,682

(22) Filed: Jan. 17, 2020

(65) Prior Publication Data
US 2020/0235239 A1    Jul. 23, 2020

(30) Foreign Application Priority Data

Jan. 21, 2019   (JP) .............................. JP2019-007837

(51) Int. Cl.
| | |
|---|---|
| *H01L 29/739* | (2006.01) |
| *H01L 29/78* | (2006.01) |
| *H01L 29/423* | (2006.01) |
| *H01L 29/16* | (2006.01) |
| *H01L 29/08* | (2006.01) |
| *H01L 29/417* | (2006.01) |

(52) U.S. Cl.
CPC ...... *H01L 29/7832* (2013.01); *H01L 29/0847* (2013.01); *H01L 29/1608* (2013.01); *H01L 29/41725* (2013.01); *H01L 29/4236* (2013.01)

(58) Field of Classification Search
None
See application file for complete search history.

(56) References Cited

U.S. PATENT DOCUMENTS

| | | | | |
|---|---|---|---|---|
| 8,519,452 | B2 * | 8/2013 | Malhan ............... | H01L 29/8083 257/280 |
| 2009/0200559 | A1 * | 8/2009 | Suzuki ............... | H01L 29/7811 257/77 |
| 2012/0286355 | A1 * | 11/2012 | Mauder ............... | H01L 29/7393 257/330 |
| 2017/0263757 | A1 | 9/2017 | Saikaku et al. | |
| 2018/0096991 | A1 * | 4/2018 | Nasu .................. | H01L 29/4238 |
| 2018/0342587 | A1 * | 11/2018 | Okumura ............ | H01L 29/7803 |

(Continued)

FOREIGN PATENT DOCUMENTS

| | | |
|---|---|---|
| JP | 2012-164851 A | 8/2012 |
| JP | 2019-046908 A | 3/2019 |

*Primary Examiner* — Ali Naraghi
(74) *Attorney, Agent, or Firm* — Posz Law Group, PLC

(57) ABSTRACT

A semiconductor device includes an inversion type semiconductor element including: a semiconductor substrate; a first conductive type layer formed on the semiconductor substrate; an electric field blocking layer formed on the first conductive type layer and including a linear shaped portion; a JFET portion formed on the first conductive type layer and having a linear shaped portion; a current dispersion layer formed on the electric field blocking layer and the JFET portion; a deep layer formed on the electric field blocking layer and the JFET portion; a base region formed on the current dispersion layer and the deep layer; a source region formed on the base region; trench gate structures including a gate trench, a gate insulation film, and a gate electrode, and arranged in a stripe shape; an interlayer insulation; a source electrode; and a drain electrode formed on a back surface side of the semiconductor substrate.

7 Claims, 17 Drawing Sheets

(56) References Cited

U.S. PATENT DOCUMENTS

2019/0081170 A1* 3/2019 Kumagai ............ H01L 29/7806
2019/0214490 A1* 7/2019 Leendertz ............. H01L 21/761
2019/0288107 A1 9/2019 Saikaku et al.

* cited by examiner

SEMICONDUCTOR DEVICE

CROSS REFERENCE TO RELATED APPLICATION

The present application claims the benefit of priority from Japanese Patent Application No. 2019-007837 filed on Jan. 21, 2019. The entire disclosure of the above application is incorporated herein by reference.

TECHNICAL FIELD

The present disclosure relates to a semiconductor device that includes a semiconductor element having a MOS structure. The present disclosure may be preferably applied to an SiC semiconductor device with a carbide silicon (hereinafter, also referred to as an SiC) as, particularly, a semiconductor material.

BACKGROUND

A semiconductor device that includes a semiconductor element having a MOS structure has been proposed.

SUMMARY

According to one example, a semiconductor device may include an inversion type semiconductor element including: a semiconductor substrate; a first conductive type layer formed on the semiconductor substrate; an electric field blocking layer formed on the first conductive type layer and including a linear shaped portion; a JFET portion formed on the first conductive type layer and having a linear shaped portion; a current dispersion layer formed on the electric field blocking layer and the JFET portion; a deep layer formed on the electric field blocking layer and the JFET portion; a base region formed on the current dispersion layer and the deep layer; a source region formed on the base region; trench gate structures including a gate trench, a gate insulation film, and a gate electrode, and arranged in a stripe shape; an interlayer insulation; a source electrode; and a drain electrode formed on a back surface side of the semiconductor substrate.

BRIEF DESCRIPTION OF DRAWINGS

FIG. 4 is a diagram showing time changes of a gate voltage Vg, a drain voltage Vd, and a drain current Id when a MOSFET is turned on;

DETAILED DESCRIPTION

Figure 1:
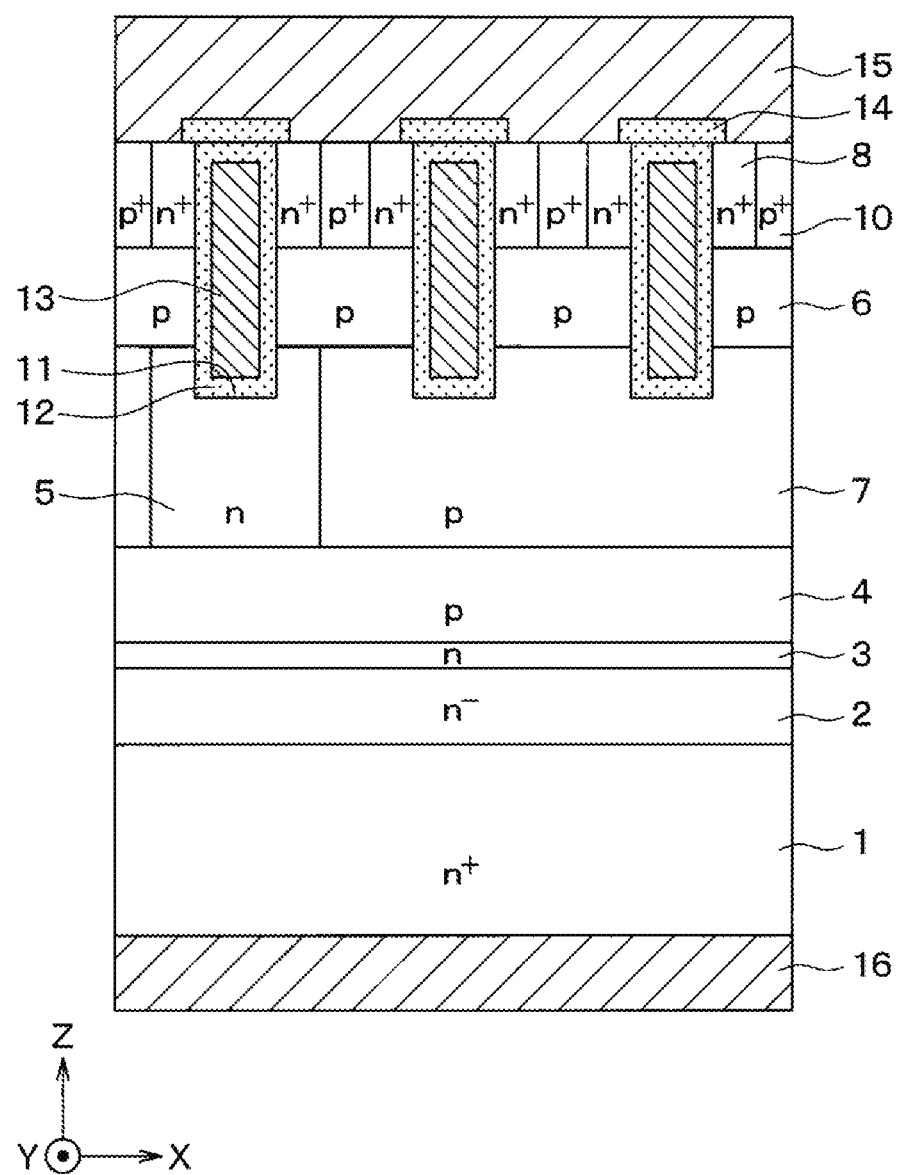
FIG. 1 is a cross-sectional view illustrating an SiC semiconductor device according to a first embodiment.

A semiconductor device that includes a semiconductor element having a MOS structure has been proposed. For example, the semiconductor element having the MOS structure includes a MOSFET having a trench gate structure as a structure in which a channel density is set to be high so that a large current can flow. This MOSFET has a structure in which a p type base region and an n type source region are sequentially formed on an n type drift layer formed on an n$^+$ type substrate. In the structure, multiple trench gates are formed so as to penetrate the p type base region from a surface of the n type source region to reach the n type drift layer. In addition, an electric field relaxation layer extending in a direction crossing a longitudinal direction of the trench gate is formed under the p type base region. Thereby, an occurrence of an electric field concentration to a bottom of the trench gate is relaxed, and insulation breakdown of a gate insulation film is suppressed.

The MOSFET is laid out in a stripe shape by arranging multiple gate electrodes in parallel. The n type source region is formed in each of both sides of each gate electrode. A channel region is formed in a portion positioned between the n type source region and the n type drift layer in the gate electrode, and a drain current flows between the source and drain.

Then, an on-resistance Ron and a gate-drain capacitance Cgd of the MOSFET are in a trade-off relation, and the gate-drain capacitance Cgd increases as the on-resistance Ron decreases.

It may be desired to improve this trade-off relation and to suppress the gate-drain capacitance Cgd while reducing the on-resistance Ron. For example, the gate-drain capacitance Cgd is determined based on an area of a boundary region between a portion positioned under the p type base region in the trench gate and the n type drift layer. Therefore, as a comparative example, a structure in which a portion of the electric field relaxation layer is orthogonal to the trench gate has been proposed. At the portion crossing the electric field relaxation layer, the trench gate is covered with the electric field relaxation layer, and, according to this, it may be possible to provide a structure capable of decreasing the gate-drain capacitance Cgd.

However, it has been found that, in order to further improve switching characteristics, in addition to reduction of the gate-drain capacitance Cgd, it may be necessary to reduce a feedback capacitance Crss of the MOSFET so that the reduction amount of the feedback capacitance Crss is equal to or higher than a reduction amount of an input capacitance Ciss. That is, it has been confirmed that a configuration in which a portion of the electric field relaxation layer is merely orthogonal to the trench gate as the comparative example, is not sufficient.

One example provides a semiconductor device capable of further improving a switching characteristics and improving a trade-off relation between an on-resistance and a gate-drain capacitance.

According to one example embodiment, a semiconductor device includes an inversion type semiconductor element that includes: a semiconductor substrate that has a first conductive type or a second conductive type; a first conductive type layer that is formed on the semiconductor substrate, and is made of a semiconductor having the first conductive type and an impurity concentration lower than an impurity concentration of the semiconductor substrate; an electric field blocking layer that is formed on the first conductive type layer, and are made of a semiconductor having the second conductive type and including at least a linear shaped portion when the electric field blocking layers is viewed from a normal direction of the semiconductor substrate; a JFET portion that is formed on the first conductive type layer, is sandwiched by the electric field blocking layer, and is made of a semiconductor having the first conductive type and a linear shaped portion when the JFET portion is viewed from the normal direction of the semiconductor substrate; a current dispersion layer that is formed on the electric field blocking layer and the JFET portion, and is made of a semiconductor having the first conductive type and an impurity concentration higher than the impurity concentration of the first conductive type layer; a deep layer that has the second conductive type, is formed on the electric field blocking layer and the JFET portion together with the current dispersion layer; a base region that is formed on the current dispersion layer and the deep layer, and is made of a semiconductor having the second conductive type; a source region that is formed on the base region, and is made of a semiconductor having the first conductive type and a first conductive type impurity concentration higher than a first conductive type impurity concentration of the first conductive type layer; multiple trench gate structures that include a gate trench formed deeper than the base region from a surface of the source region, a gate insulation film covering an inner wall of the gate trench, and a gate electrode placed on the gate insulation film, and are arranged in a stripe shape, wherein one direction corresponds to a longitudinal direction of the multiple trench gate structures; an interlayer insulation film that covers the gate electrode and the gate insulation film, and includes a contact hole; a source electrode that is ohmic-contacted to the source region through the contact hole; and a drain electrode that is formed on a back surface side of the semiconductor substrate. A numeral number of the current dispersion layer is lower than a numeral number of the multiple trench gate structures. At least a portion of a bottom of the multiple trench gate structures is covered with the deep layer.

In such a manner, the current dispersion layer is not formed for all the trench gate structure, and the numeral number of the current dispersion layer is set to be lower than that of trench gate structures. Therefore, it may be possible to provide a configuration in which the portion configuring the gate-drain capacitance in the trench gate structure is only the portion contacted to the current dispersion layer. It may be possible to reduce the gate-drain capacitance. Since the present embodiment includes the portion in which the trench gate structure is formed and the n type current dispersion layer is not formed, the gate-source capacitance is constant. Therefore, it may be possible to reduce the value obtained by dividing the gate-drain capacitance by the gate-source capacitance.

It may be possible to provide the semiconductor device capable of improving the trade-off relation between the on-resistance and the gate-drain capacitance while improving the switching characteristics.

According to another example embodiment, a semiconductor device includes: an inversion type semiconductor element that includes: a semiconductor substrate that has a first conductive type or a second conductive type; a first conductive type layer that is formed on the semiconductor substrate, and is made of a semiconductor having the first conductive type and an impurity concentration lower than an impurity concentration of the semiconductor substrate; an electric field blocking layer that are formed on the first conductive type layer, and are made of a semiconductor having the second conductive type and including at least a linear shaped portion when the electric field blocking layer is viewed from a normal direction of the semiconductor substrate; a JFET portion that is formed on the first conductive type layer, and is made of a semiconductor having the first conductive type and a linear shaped portion sandwiched by the electric field blocking layer when the JFET portion is viewed from the normal direction of the semiconductor substrate; a current dispersion layer that is formed on the electric field blocking layer and the JFET portion, and is made of a semiconductor having the first conductive type and an impurity concentration higher than the impurity concentration of the first conductive type layer; a deep layer that has the second conductive type, is formed on the electric field blocking layer and the JFET portion together with the current dispersion layer; a base region that is formed on the current dispersion layer and the deep layer, and is made of a semiconductor having the second conductive type; a source region that is formed on the base region, and is made of a semiconductor having the first conductive type and a first conductive type impurity concentration higher than a first conductive type impurity concentration of the first conductive type layer; multiple trench gate structures that include a gate trench formed deeper than the base region from a surface of the source region, a gate insulation film covering an inner wall of the gate trench, and a gate electrode placed on the gate insulation film, and are arranged in a stripe shape, wherein one direction corresponds to a longitudinal direction of the multiple trench gate structures; an interlayer insulation film that covers the gate electrode and the gate insulation film, and includes a contact hole; a source electrode that is ohmic-contacted to the source region through the contact hole; and a drain electrode that is formed on a back surface side of the semiconductor substrate. A longitudinal direction of the electric field blocking layer corresponds to a direction similar to the longitudinal direction of the multiple trench gate structures. A longitudinal direction of the deep layer corresponds to a direction crossing the longitudinal direction of the multiple trench gate structures and the longitudinal direction of the electric field blocking layer. A portion of each of the multiple trench gate structures is connected with the current dispersion layer. A bottom of a remaining portion of each of the multiple trench gate structures is covered with the deep layer.

Furthermore, according to another example embodiment, a semiconductor device includes: an inversion type semiconductor element that includes: a semiconductor substrate that has a first conductive type or a second conductive type; a first conductive type layer that is formed on the semiconductor substrate, and is made of a semiconductor having the first conductive type and an impurity concentration lower than an impurity concentration of the semiconductor substrate; a JFET portion that is formed on the first conductive layer, and is made of a semiconductor having the first conductive type; a base region that has the second type conductive type, is formed on the first conductive layer together with the JFET portion; a source region that is formed on the base region, and is made of a semiconductor having the first conductive type and a first conductive type impurity concentration higher than a first conductive type impurity concentration of the first conductive type layer; multiple gate structures that include a gate insulation film formed on the source region and the base region, and a gate electrode formed on the gate insulation film, and are arranged in a stripe shape, wherein one direction corresponds to a longitudinal direction of the multiple gate structures; an interlayer insulation film that covers the gate electrode and the gate insulation film, and includes a contact hole; a source electrode that is ohmic-contacted to the source region through the contact hole; and a drain electrode that is formed on a back surface side of the semiconductor substrate. A numeral number of the JFET portion is lower than a numeral number of the multiple gate structures. A bottom of the multiple gate structures is contacted to only the base region, or contacted to only both of the base region and the source region.

Hereinafter, embodiments of the present disclosure will be described with reference to the drawings. In the following embodiments, the same reference numerals are assigned to portions that are the same or equivalent to each other for description.

First Embodiment

Figure 2:
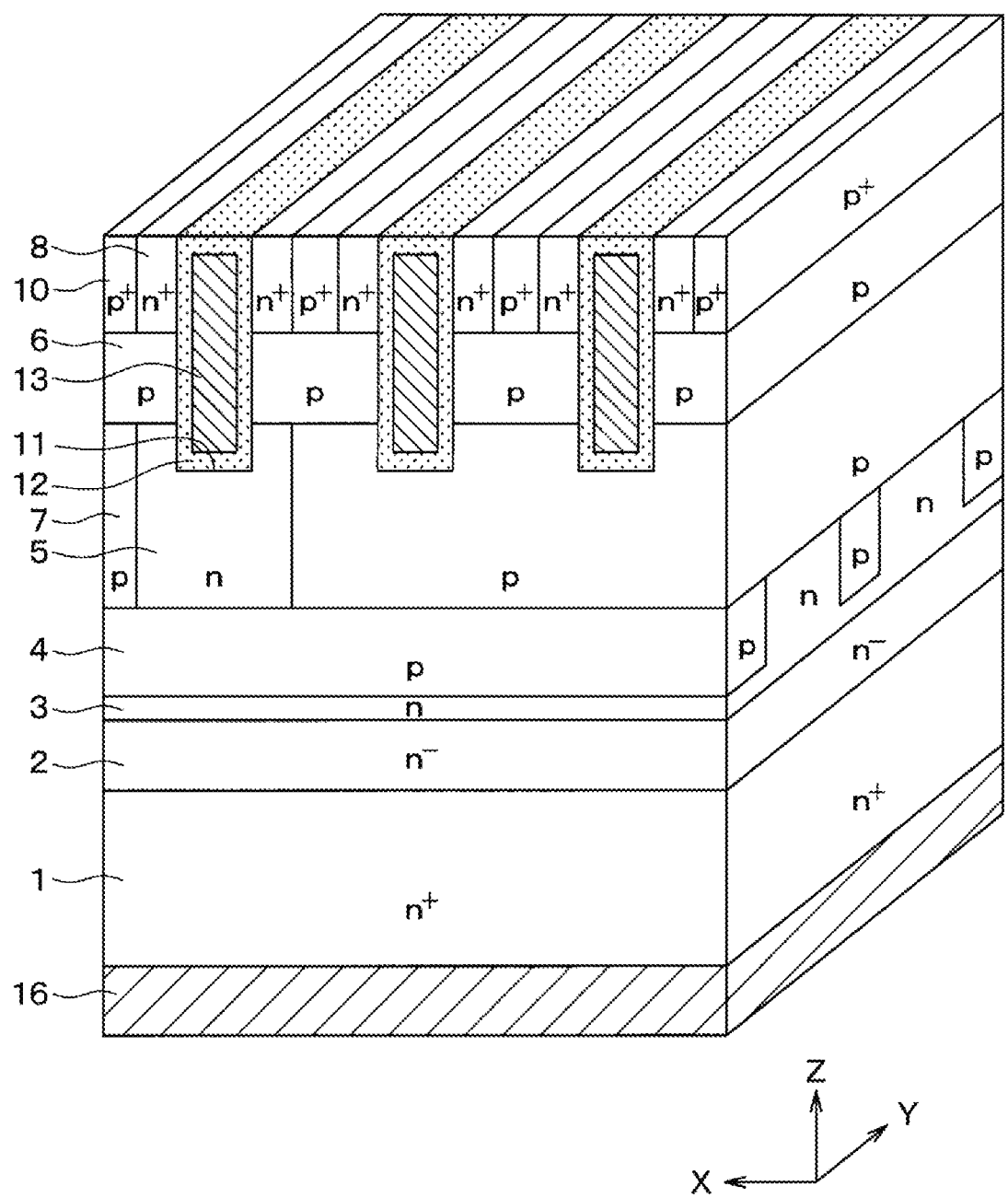
FIG. 2 is a perspective cross-sectional view illustrating a portion of the SiC semiconductor device shown in FIG. 1.

A first embodiment will be described. In the present embodiment, an SiC semiconductor device using an SiC as a semiconductor material will be described as an example. The SiC semiconductor device of the present embodiment includes an inverted vertical MOSFET with a trench gate structure shown in FIGS. 1 and 2, as a semiconductor element. The vertical MOSFET shown in FIGS. 1 and 2 is formed in a cell region of the SiC semiconductor device. The SiC semiconductor device is configured by forming an outer peripheral withstand voltage structure so as to surround the cell region. Here, only the vertical MOSFET is illustrated in the drawings. In the following description, as shown in FIGS. 1 and 2, a width direction of the vertical MOSFET is defined as an X direction, a first depth direction of the vertical MOSFET crossing the X direction is defined as a Y direction, and a thickness direction or a second depth direction of the vertical MOSFET that is the normal direction to the XY plane is defined as the Z direction.

As shown in FIGS. 1 and 2, in the SiC semiconductor device, an $n^+$ type substrate 1 made of SiC is used as a semiconductor substrate. An $n^-$ type layer 2 made of SiC is formed on a main surface of the $n^+$ type substrate 1. A surface of the $n^+$ type substrate 1 is a (0001) Si surface, for example, an n type impurity concentration is $5.9 \times 10^{18}/cm^3$, and a thickness is 100 μm. For example, in the $n^-$ type layer 2, an n type impurity concentration is $7.0 \times 10^{15}$ to $1.0 \times 10^{16}/cm^3$, and a thickness is 8.0 μm.

A JFET portion 3 made of SiC and an electric field blocking layer 4 are formed on the $n^-$ type layer 2. A portion of the $n^-$ type layer 2 away from the $n^+$ type substrate 1 is connected to the JFET portion 3.

The JFET portion 3 and the electric field blocking layer 4 configure a saturation current suppression layer, and both of the JFET portion 3 and the electric field blocking layer 4 extend in the X direction and are alternately arranged in the Y direction. That is, when viewed from the normal direction with respect to the main surface of the $n^+$ type substrate 1, at least a portion of the JFET portion 3 and the electric field blocking layer 4 are each formed into multiple strip lines, that is, in a strip shape, and are alternately arranged.

In the present embodiment, the JFET portion 3 is formed at a similar position with the electric field blocking layer 4 in a Z direction, and also formed under the electric field blocking layer 4. Therefore, though the stripe shaped portions of the JFET portion 3 are connected to the portion under the electric field blocking layer 4, each of the stripe shaped portions is placed between the multiple electric field blocking layers 4.

Each stripe shaped portion of the JFET portion 3, that is, each portion forming the stripe lines, has a width of, for example, 0.25 μm and a pitch corresponding to a formation interval of, for example, 0.6 to 2.0 μm. The thickness of the JFET portion 3 is 1.5 μm, for example, and the n type impurity concentration is higher than that of the $n^-$ type layer 2, and is, for example, $5.0 \times 10^{17}$ to $2.0 \times 10^{18}/cm^3$.

The electric field blocking layer 4 corresponds to a portion configuring a lower portion that is a portion of the electric field relaxation layer, and is made of a p type impurity layer. As described above, the electric field blocking layer 4 has the stripe shape, and each strip shaped portion of the stripe shaped electric field blocking layer 4 has a width of, for example, 0.5 μm and a thickness of, for example, 1.4 μm. The electric field blocking layer 4 has a p type impurity concentration of, for example, $3.0 \times 10^{17}$ to $1.0 \times 10^{18}/cm^3$. In the present embodiment, the electric field blocking layer 4 has a constant p type impurity concentration in the depth direction. In the electric field blocking layer 4, a surface opposite to the $n^-$ type layer 2 is disposed on the same plane as the surface of the JFET portion 3.

Further, an n type current dispersion layer 5 made of SiC is formed on the JFET portion 3 and the electric field blocking layer 4. The n type current dispersion layer 5 corresponds to a layer for diffusing a current flowing through a channel in the X direction, as described later. For example, the n type impurity concentration of the n type current dispersion layer 5 is higher than that of the $n^-$ type layer 2. In the present embodiment, the n type current dispersion layer 5 extends along the Y direction as a longitudinal direction, and the n type impurity concentration is equal to or higher than that of the JFET portion 3, and the thickness is, for example, 0.5 μm.

Here, for convenience, the drift layer is described as being divided into the n⁻ type layer 2, the JFET portion 3, and the n type current dispersion layer 5. However, these correspond to portions that configure the drift layer, and are connected to each other.

A p type base region 6 made of SiC is formed on the n type current dispersion layer 5. Further, a p type deep layer 7 is formed under the p type base region 6, specifically, in a portion between the surface of the JFET portion 3 and the electric field blocking layer 4 and also in the portion of the p type base region 6 where the n type current dispersion layer 5 is not formed. The p type deep layer 7 configures an upper portion corresponding to a portion of the electric field relaxation layer. In the present embodiment, the p type deep layer 7 extends along the direction crossing the longitudinal direction of the stripe shaped portion of the JFET portion 3 and the electric field blocking layer 4, the direction being defined as the Y direction as the longitudinal direction, here. The multiple deep layers 7 and the n type current dispersion layers 5 are alternately arranged in the X direction. The p type base region 6 and the electric field blocking layer 4 are electrically connected through the p type deep layer 7. The formation pitch of the n type current dispersion layer 5 or the p type deep layer 7 is matched to a formation pitch of the trench gate structure described later. The numeral number of the n type current dispersion layer 5 or the p type deep layer 7 is set to be lower than that of the trench gate structures. In the present embodiment, a ratio of the numeral number of the current dispersion layer to the numeral number of the multiple trench gate structures is set to a ratio of one to two or more.

Furthermore, an n type source region 8 is formed on the p type base region 6. The n type source region 8 is formed in a portion of the p type base region 6 in accordance with the trench gate structure described later, and is formed on both sides of the trench gate structure.

The thickness of the p type base region 6 is lower than that of the electric field blocking layer 4 and the p type impurity concentration of the p type base region 6 is lower than that of the electric field blocking layer 4. For example, the p type impurity concentration is $3\times10^{17}/cm^3$ and the thickness is 0.4 to 0.6 μm. The p type deep layer 7 has the similar thickness to that of the n type current dispersion layer 5 and the p type impurity concentration may be any value. For example, the thickness is equal to that of the electric field blocking layer 4.

The n type source region 8 is a region for contacting with a source electrode 15 described later, and the n type impurity of the n type source region 8 has a high concentration. For example, the n type source region 8 has the n type impurity concentration of $1.0\times10^{18}$ to $5.0\times10^{19}/cm^3$ and a thickness of 0.3 to 0.7 μm.

Further, a p type connection layer 10 is formed at a position on the p type base region 6 in accordance with the p type deep layer 7, in other words, the position that is different from the n type source region 8 and opposite to the trench gate structure so that the p type connection layer 10 and the trench gate structure sandwich the n type source region 8. The p type connection layer 10 corresponds to a layer for electrically connecting the p type base region 6 and the source electrode 15 described later by connecting them.

The p type connection layer 10 corresponds to a portion that contacts with the source electrode 15 as a contact region. For example, the p type connection layer 10 has a p type impurity concentration set to be a high concentration in a range between $2.0\times10^{18}$ to $1.0\times10^{20}/cm^3$ and a thickness of 0.3 to 0.7 μm. In the present embodiment, since the p type connection layer 10 is formed by ion implantation into the n type source region 8, a carrier concentration, that is, the p type impurity concentration for functioning as the carrier is $2.0\times10^{18}$ to $1.0\times10^{20}/cm^3$. That is, a portion of the p type impurity is canceled with the n type impurity of the n type source region 8 before the implantation, and does not function as the carrier. Therefore, when the p type connection layer 10 is formed by the ion implantation, the p type impurity is implanted with a dose amount corresponding to 2 to 10 times the amount of the n type impurity concentration of the n type source region 8 in consideration of the activation rate, for example. Thereby, the p type impurity concentration described above is obtained.

Further, for example, the gate trench 11 has the width of 0.4 μm and the depth deeper by 0.2 to 0.4 μm than the total film thickness of the p type base region 6 and the n type source region 8, so as to penetrate the n type source region 8 and the p type base region 6 and to reach the n type current dispersion layer 5. The above described p type base region 6 and n type source region 8 are arranged so as to be in contact with the side surface of the gate trench 11. The gate trench 11 has a stripe shaped layout with the X direction in FIG. 2 defined as the width direction, the direction that crosses the longitudinal direction of the JFET portion 3 or the electric field blocking layer 4 and is defined as the Y direction as the longitudinal direction, and the Z direction as the depth direction. The multiple gate trenches 11 are formed in the stripe shape so as to be arranged at equal intervals in the X direction, and the p type base region 6 and the n type source region 8 are arranged therebetween. In addition, the p type deep layer 7 and the p type connection layer 10 are arranged at an intermediate position between each of the gate trenches 11.

At the side surface of the gate trench 11, the p type base region 6 forms a channel region that connects the n type source region 8 and the n type current dispersion layer 5 when the vertical MOSFET is operated. An inner wall surface of the gate trench 11 including the channel region is covered with a gate insulation film 12. A gate electrode 13 made of doped Poly-Si is formed on the surface of the gate insulation film 12. The gate trench 11 is completely filled with the gate insulation film 12 and the gate electrode 13, and thereby the trench gate structure is formed.

The source electrode 15 and a gate wiring layer (not shown) are formed on the surface of the n type source region 8 and the surface of the gate electrode 13 through an interlayer insulation film 14. The source electrode 15 and the gate wire layer are made of multiple metals, for example, such as Ni/Al. At least, a portion in contact with n type SiC among the multiple metals, specifically, the n type source region 8, is made of a metal capable of ohmic contact with the n type SiC. In addition, at least, a portion in contact with p type SiC among the multiple metals, specifically, in contact with the p type connection layer 10, is made of a metal capable of ohmic contact with the p type SiC. The source electrode 15 is formed on the interlayer insulation film 14 and is electrically insulated from the SiC portion. However, the source electrode 15 is electrically connected to the n type source region 8 and the p type connection layer 10 through a contact hole formed in the interlayer insulation film 14. Since the p type base region 6, the p type deep layer 7 and the electric field blocking layer 4 are connected through the p type connection layer 10, all of these are set to be the source potential.

By contrast, a drain electrode 16 electrically connected to the n+ type substrate 1 is formed on a back surface of the n+ type substrate 1. The structure described above configures an inverted vertical MOSFET that has an n channel type and the trench gate structure. A cell region is configured by arranging multiple cells of the vertical MOSFET described above. The SiC semiconductor device is formed by configuring an outer peripheral withstand structure with a guard ring (not shown) or the like so as to surround the cell region in which the vertical MOSFETs described above are formed.

The SiC semiconductor device having the vertical MOSFETs configured as described above is operated, for example, by applying a gate voltage Vg of 20 V to the gate electrode 13 in a state where a source voltage Vs is 0 V and a drain voltage Vd is 1 V to 1.5 V. That is, the vertical MOSFET forms the channel region in a portion of the p type base region 6 in contact with the gate trench 11 when the gate voltage Vg is applied. Thereby, the n type source region 8 and the n type current dispersion layer 5 are electrically conducted. Therefore, the vertical MOSFET performs an operation for passing a current between the drain and the source from the n+ type substrate 1 through the drift layer including the n− type layer 2, the JFET portion 3, and the n type current dispersion layer 5, and further from the channel region through the n type source region 8.

When the vertical MOSFET of the semiconductor device described above is applied to an inverter circuit placed in each of an upper arm and a lower arm or the like, a parasitic diode operates as a free wheel diode. Specifically, a PN junction between the n type layer configuring the drift layer such as the n− type layer 2 and the p type layer including the electric field blocking layer 4, the p type base region 6, or the p type deep layer 7 configures the parasitic diode, and the parasitic diode operates as the free wheel diode.

The inverter circuit or the like is used when an alternating current (also referred to as an AC) is supplied to a load such as an alternating motor while a direct current power source is used. For example, multiple bridge circuits in each of which the upper arm and the lower arm are connected to the direct current power source in series are connected in parallel. By repeating to mutually turn on and off the upper arm and the lower arm of each bridge circuit, the inverter circuit or the like supplies the AC to the load connected between these.

Specifically, in each bridge circuit of the inverter circuit or the like, the vertical MOSFET of the upper arm is turned on and the vertical MOSFET of the lower arm is turned off, and thereby the current is supplied to the load. Thereafter, the vertical MOSFET of the upper arm is turned off and the vertical MOSFET of the lower arm is turned on, and the current supply is stopped. When an on-state and an off-sate of the vertical MOSFET for each arm are switched, the parasitic diode of the vertical MOSFET that is turned off operates as the free wheel diode. The free wheel diode performs reverse conduction operation of flowing the free wheel current between the source and the drain. In this way, AC driving of the load by the inverter circuit or the like is performed.

In performing such an operation, it may be important to improve the switching characteristics in addition to improvement in a trade-off relation between the on-resistance Ron and the gate-drain capacitance Cgd. Hereinafter, the improvement of the trade-off relation and the improvement of the switching characteristics will be described.

Figure 3:
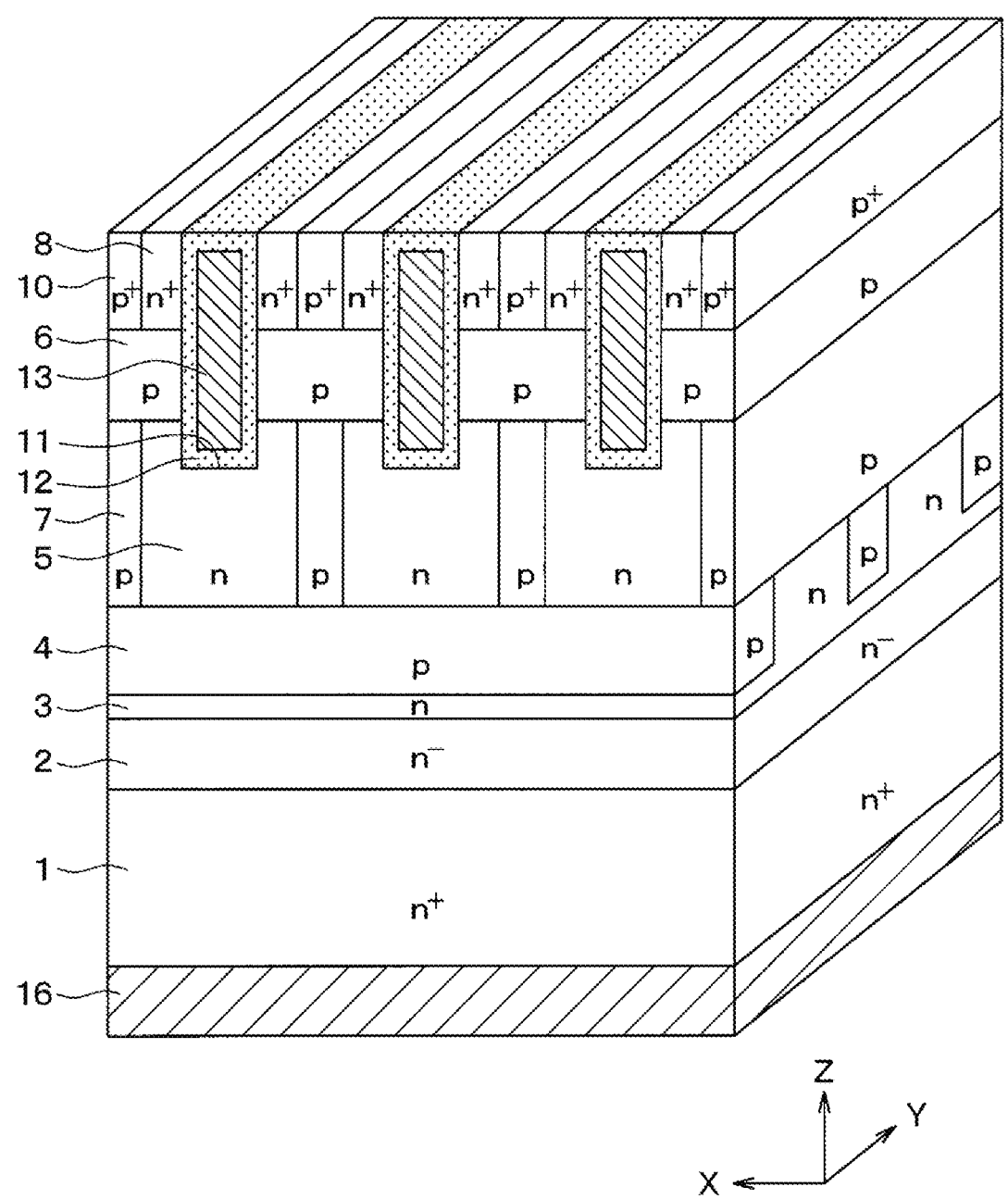
FIG. 3 is a perspective cross-sectional view illustrating a portion of an SiC semiconductor device as a reference structure for comparison with the first embodiment.

As a reference structure, a semiconductor device having a structure shown in FIG. 3 was investigated. The reference structure corresponds to a structure in which the n type current dispersion layer 5 is formed for each trench gate structure.

Regarding the semiconductor device having this reference structure, the relation between the on-resistance Ron and the gate-drain capacitance Cgd was examined. In this semiconductor device, the n type source region 8 is formed on both sides of each of the multiple gate electrodes 13, and the bottom of each trench gate structure and the n type current dispersion layer 5 are contacted to each other. In the structure described above, when the channel regions are formed, the drain current flows between the source and the drain through all the channel regions.

This semiconductor device has a structure in which, as a portion of the electric field relaxation layer, the electric field blocking layer 4 is orthogonal to the trench gate structure. Therefore, in the orthogonal region, the trench gate structure is able to be covered with the electric field relaxation layer, and, according to this, it may be possible to provide a structure capable of reducing the gate-drain capacitance Cgd. That is, in the electric field relaxation layer, through the p type base region 6, the source potential is set to 0 V here. Therefore, a capacitance is not formed in a portion covered with the electric field blocking layer 4 in the trench gate, and accordingly, it may be possible to reduce the gate-drain capacitance Cgd.

The MOSFET includes a parasitic capacitance such as the gate-drain capacitance Cgd. However, for improving the switching characteristics, it may be desired that the parasitic capacitance is as small as possible. For example, the gate-drain capacitance Cgd corresponds to a feedback capacitance Crss. When the feedback capacitance Crss is large, the drain current rises or falls slowly. A value obtained by adding the gate-source capacitance Cgs and the gate-drain capacitance Cgd is called an input capacitance Ciss, and the input capacitance Ciss is charged to drive the MOSFET. Therefore, when the input capacitance Ciss is large, the drive capability is reduced. In such a manner, when the parasitic capacitance such as the feedback capacitance Crss or the input capacitance Ciss is large, the switching characteristics of the MOSFET are not improved. Therefore, it may be necessary to reduce the parasitic characteristics for improving the switching characteristics Therefore, it may be preferable to be capable of reducing the gate-drain capacitance Cgd corresponding to the feedback capacitance Crss as described above for improving the switching characteristics.

However, it has been found that, in order to further improve the switching characteristics, in addition to reduction of the gate-drain capacitance Cgd, it may be necessary to reduce the feedback capacitance Crss of the MOSFET so that the reduction amount of the feedback capacitance Crss is equal to or higher than the reduction amount of the input capacitance Ciss.

Figure 4:
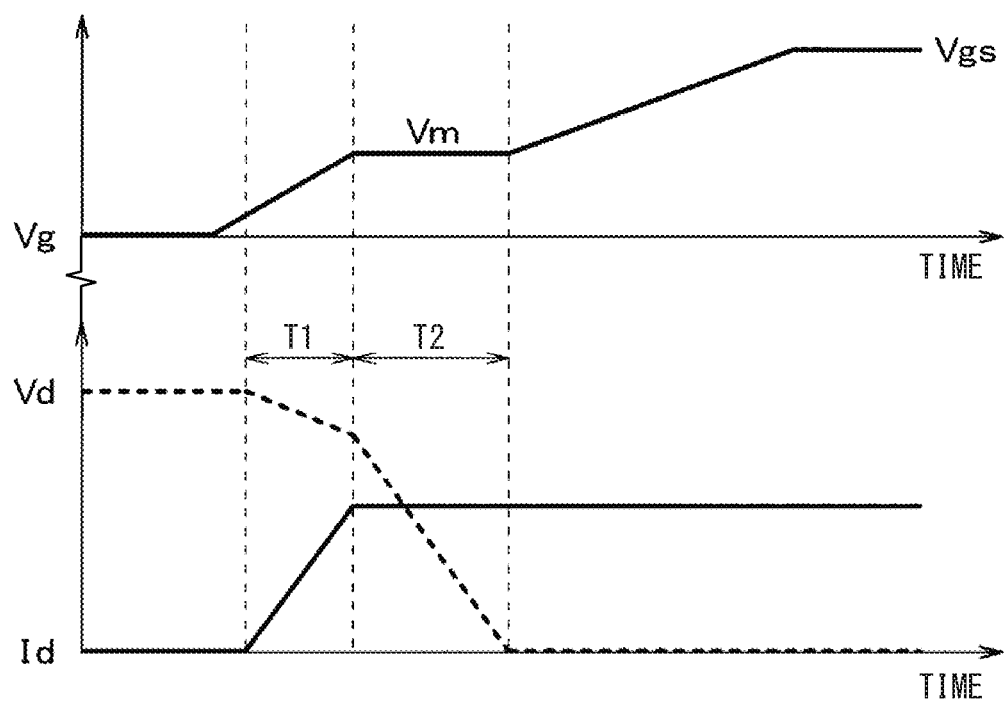

Specifically, when a gate-source voltage Vgs is set to a predetermined voltage, as shown in FIG. 4, the gate voltage Vg rises and the drain voltage Vd and the drain current Id change. That is, in a term (1), the gate voltage Vg gradually increases. In a term (2), the gate voltage Vg becomes constant at a mirror voltage Vm. Thereafter, the gate voltage Vg gradually increases again, reaches the desired gate-source voltage Vgs, and stabilizes. In the term (1), the drain current Id increases with an inclination of dId/dt. In the term (1) and the term (2), the drain voltage Vd gradually decreases. The mirror voltage Vm corresponds to a voltage entering a mirror region in a transient state when a switching element of an insulation gate type such as the MOSFET is turned on or off. The term (1) may be also referred to as a T1. The term (2) may be also referred to as a T2.

Here, in order to improve the switching characteristics, it may be necessary to shorten a time required for the term (1) and the term (2) as long as possible. The term (1) is proportional to a division value obtained by dividing by the mirror voltage Vm, an integration value of a gate resistance Rg for adjustment placed in an input stage of the gate electrode 13 and the input capacitance Ciss. The term (1) is expressed by a mathematical equation 1. The term (2) is proportional to a value obtained by a division value obtained by dividing by a difference between the gate-source voltage Vgs and the mirror voltage Vm, an integration value of the gate resistance Rg and the feedback capacitance Crss. The term (2) is expressed by a mathematical equation 2.

$$T1 \propto Rg \cdot Ciss/Vm \quad \text{(Mathematical Equation 1)}$$

$$T2 \propto Rg \cdot Crss/(Vgs-Vm) \quad \text{(Mathematical Equation 2)}$$

The term (1) can be also shortened. However, when the inclination of the increase in the drain current Id is excessively large, the surge increases. Therefore, it may be preferable to keep the drain current Id below a certain value. Therefore, it may be necessary to shorten the time of the term (2). A control for keeping the certain value in the term (1) is assumed in order to keep the inclination of dId/dt below the certain value. When the input capacitance Ciss is to be reduced, based on the equation 1, the gate resistance Rg increases. By contrast, in this condition, in order to reduce the time of the term (2), it may be necessary to reduce the feedback capacitance Crss based on the equation 2 since the gate resistance Rg is high. In consideration that the an increase rate of the gate resistance Rg is similar to the decrease rate of the input capacitance Ciss, it may be possible to shorten the term (2) when a decrease rate of the feedback capacitance Crss is equal to or higher than the decrease rate of the input capacitance Ciss. In other words, it may be necessary to reduce a value obtained by dividing the feedback capacitance Crss by the input capacitance Ciss (i.e., a value of Crss/Ciss) as long as possible for shortening the term (2).

As described above, the feedback capacitance Crss is equal to the gate-drain capacitance Cgd, and the input capacitance Ciss corresponds to a value obtained by adding the gate-source capacitance Cgs to the gate-drain capacitance Cgd. Since the gate-drain capacitance Cgd is sufficiently small with respect to the gate-source capacitance Cgs, the mathematical equation that the input capacitance Ciss is nearly equal to the gate-source capacitance Cgs (i.e., Ciss≈Cgs) is provided. Therefore, a mathematical equation that the value of Crss/Ciss is nearly equal to a value obtained by dividing the gate-drain capacitance Cgd by the gate-source capacitance Cgs (i.e., Cgd/Cgs) is provided (in other words, the mathematical equation of Crss/Ciss≈Cgd/Cgs is provided). In order to shorten the term (2), it may be necessary to reduce the value of Cgd/Cgs.

Based on the above, in the semiconductor device according to the present embodiment, as shown in FIGS. 1 and 2, the n type current dispersion layer 5 is not formed for all the trench gate structure, and the numeral number of n type current dispersion layers 5 is set to be lower than that of trench gate structures. Here, the formation pitch of the n type current dispersion layer 5 is different from the formation pitch of the trench gate structure. The formation pitch of the n type current dispersion layer 5 is larger than the formation pitch of the trench gate structure. For example, one n type current dispersion layer 5 is formed when three trench gate structures are formed. Two of the trench gate structures are not connected to the current dispersion layer 5, and the entire bottom of each of the two trench gate structures is covered with the p type deep layer 7.

In this structure, the portion configuring the gate-drain capacitance Cgd in the trench gate structure is only the portion contacted to the n type current dispersion layer 5. Therefore, it may be possible to further reduce the gate-drain capacitance Cgd as compared with the reference structure in which a portion of the electric field relaxation layer is orthogonal to the trench gate structure.

Figure 5:
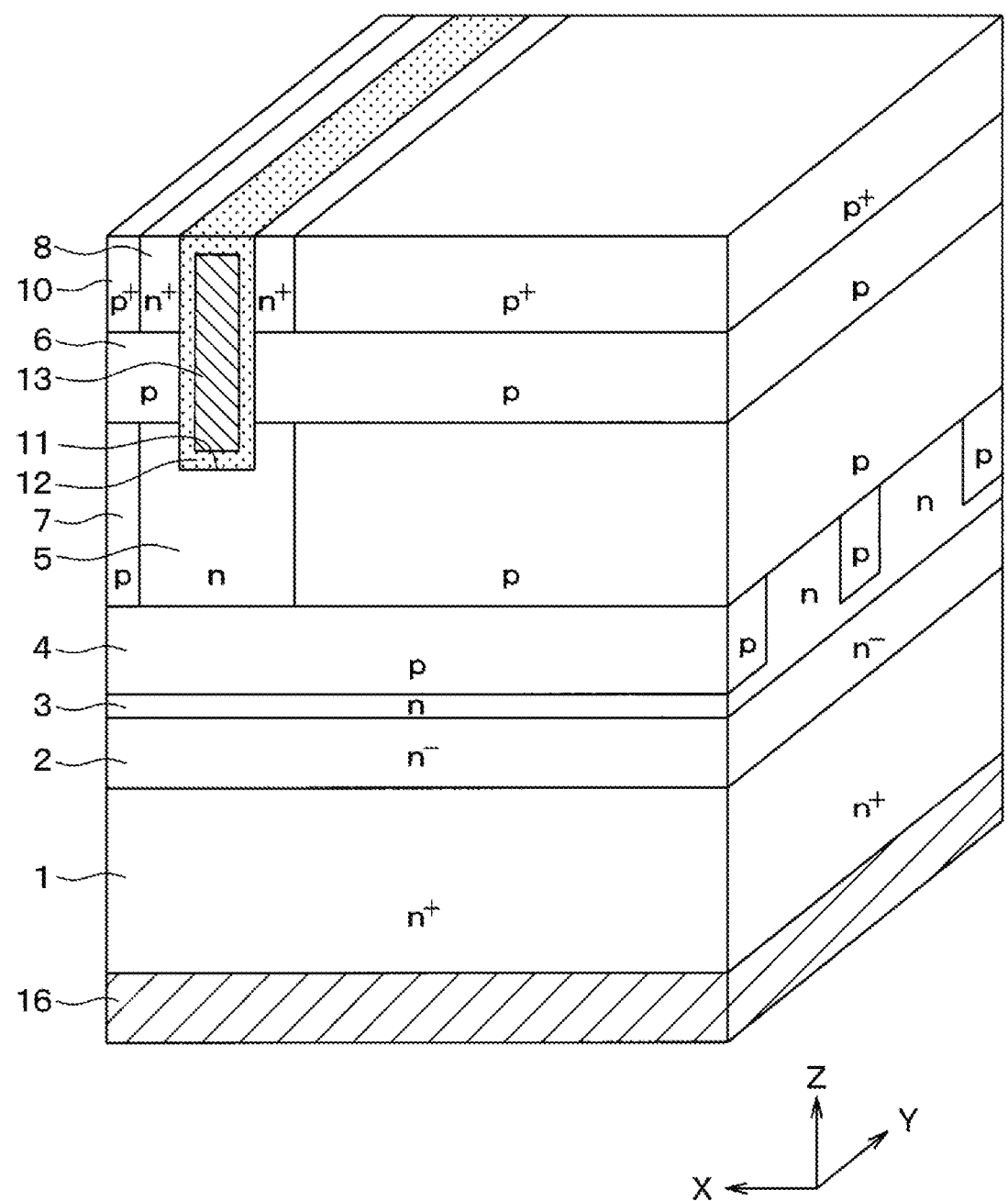
FIG. 5 is a perspective cross-sectional view illustrating a portion of an SiC semiconductor device as a reference structure when a formation pitch of a trench gate structure is set to be large.

Here, in a case of only reducing the gate-drain capacitance Cgd, as shown in FIG. 5, the formation pitch of the trench gate structure may be set to be large, and, according to this, the n type current dispersion layer 5 may be formed. However, in this structure, though the gate-drain capacitance Cgd can be reduced, the gate-source capacitance Cgs is also reduced. Therefore, it may be not possible to reduce the value of Cgd/Cgs. Hence, a structure capable of reducing the gate-drain capacitance Cgd while suppressing the gate-source capacitance Cgs from being reduced, may be desirable.

By contrast, in the semiconductor device according to the present embodiment, the trench gate structure and the n type current dispersion layer 5 are not formed in a pair. The semiconductor device includes a portion in which trench gate structure is formed and the n type current dispersion layer 5 is not formed. The gate-source capacitance Cgs is formed between the gate electrode 13 a portion sandwiching the gate insulation film 12 and having the source potential. The portion having the source potential in the contact portion with the trench gate structure corresponds to the n type source region 8, the p type base region 6, and the p type deep layer 7. The gate-source capacitance Cgs is formed between these and the gate electrode 13.

In such a manner, it may be possible to suppress the gate-source capacitance Cgs from being reduced by including the portion in which the trench gate structure is formed and the n type current dispersion layer 5 is not formed. Furthermore, it may be possible to also increase the gate-source capacitance Cgs since the gate-source capacitance Cgs can be provided between the p type deep layer 7 and the gate electrode 13. Hence, it may be possible to provide the structure capable of reducing the gate-drain capacitance Cgd while reducing the gate-source capacitance Cgs, and to reduce the value of Cgd/Cgs. Thereby, it may be possible to reduce the value of Crss/Ciss, shorten the time of the term 2 described above, and further improve the switching characteristics.

Figure 6A:
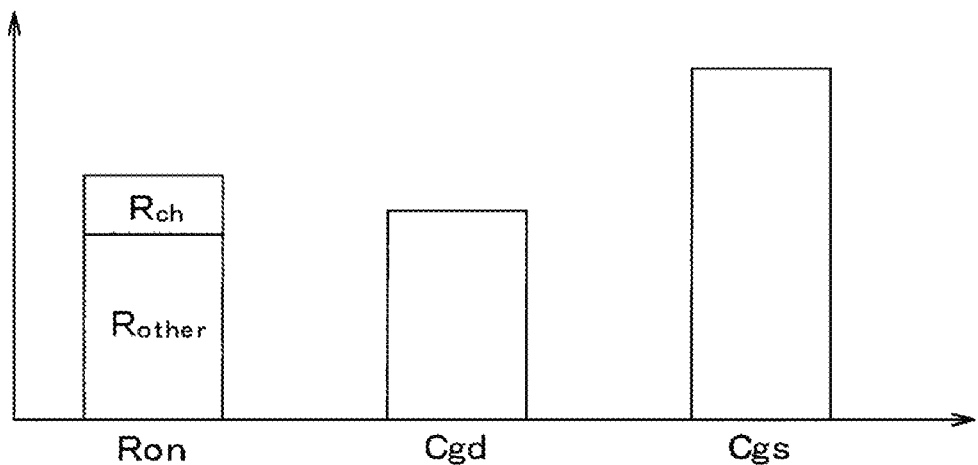
FIG. 6A is a diagram showing an on-resistance Ron, a gate-drain capacitance Cgd, and a gate-source capacitance Cgs in the SiC semiconductor device as the reference structure shown in FIG. 3.
Figure 6B:
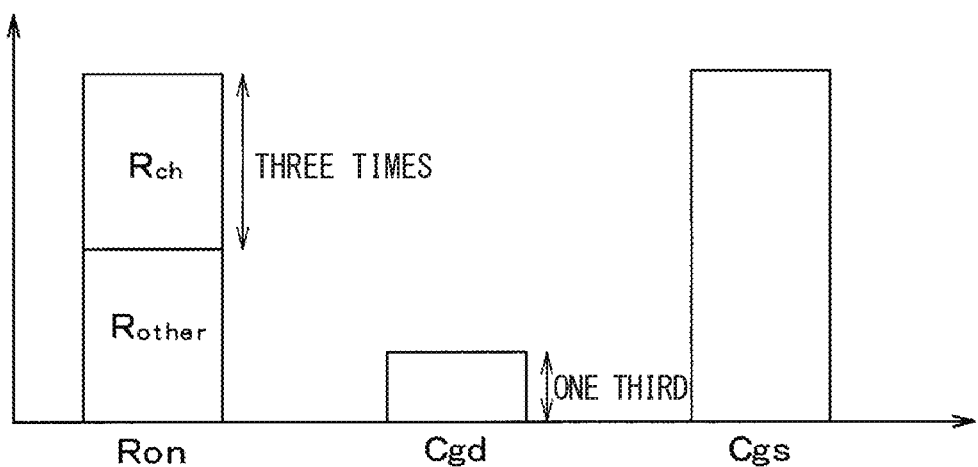
FIG. 6B is a diagram showing an on-resistance Ron, a gate-drain capacitance Cgd, and a gate-source capacitance Cgs in the SiC semiconductor device in the embodiment.

However, since the portion functioning as the channel through which the drain current flows in the trench gate structure is only the contact portion withe n type current dispersion layer 5, the on-resistance Ron may increase. Therefore, the change of the on-resistance Ron was examined. Also, the changes of the gate-drain capacitance Cgd and the gate-source capacitance Cgs that affect the switching characteristics were examined. FIG. 6A shows a result for the semiconductor device having the reference structure shown in FIG. 3A. FIG. 6B shows a result of the semiconductor device according to the present embodiment shown in FIG. 1 and FIG. 2.

The on-resistance Ron is expressed as a value obtained by adding the other resistance Rother such as the contact resistance between a channel resistance Rch and an electrode —SiC. As shown in FIG. 6A and FIG. 6B, the semiconductor device according to the present embodiment has the channel resistance Rch of which value is three times that of the semiconductor device having the reference structure.

However, though the channel resistance Rch of the semiconductor device for the present embodiment increases, there is not large difference between the other resistances Rother for the semiconductor device according to the present embodiment and the semiconductor device having the reference structure. Therefore, in view point from the on-resistance Ron as the total, the on-resistance Ron for the present embodiment slightly increases.

As described above, the gate-drain capacitance Cgd is reduced, the value of the gate-drain capacitance Cgd according to the present embodiment is ⅓ of that of the semiconductor device having the reference structure. Further, the gate-source capacitance Cgs is suppressed from being reduced, and it may be possible to form the gate-source capacitance Cgs between the p type deep layer 7 and the gate electrode 13. Therefore, the gate-source capacitance Cgs of the semiconductor device according to the present embodiment is equal to or higher than that of the semiconductor device having the reference structure.

Figure 7A:
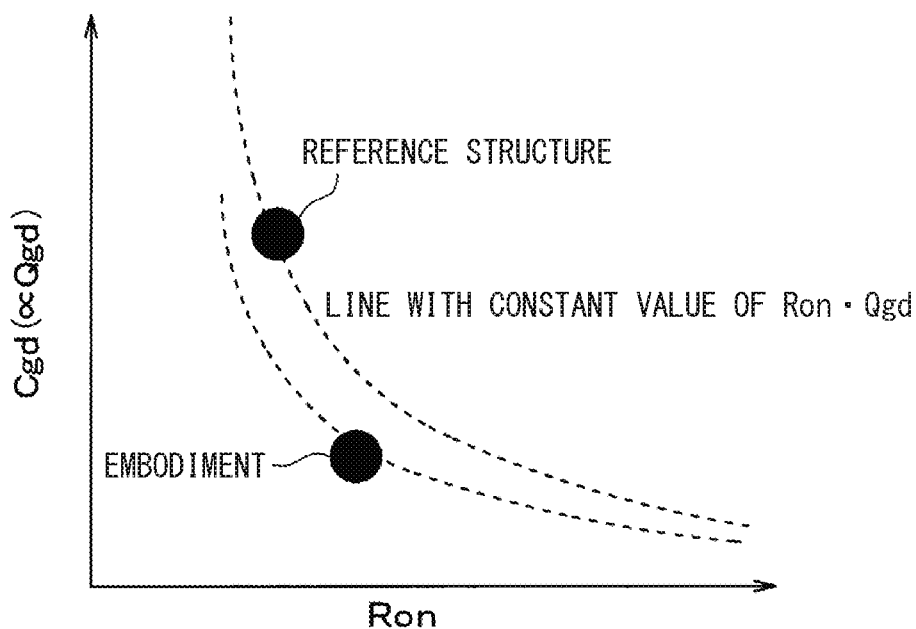
FIG. 7A is a diagram showing an investigation result of a relation between the on-resistance Ron and the gate-drain capacitance Cgd.

Furthermore, regarding the semiconductor device having the reference structure and the semiconductor device according to the present embodiment, the relation between the on-resistance Ron and the gate-drain capacitance Cgd and the relation of the value obtained by dividing the gate-drain capacitance Cgd by the gate-source capacitance Cgs were also examined. The results are relations shown in FIG. 7A and FIG. 7B. That is, as shown in FIG. 7A, regarding the relation between the on-resistance Ron and the gate-drain capacitance Cgd, each of the semiconductor devices has a trade-off relation that the gate-drain capacitance Cgd increases as the on-resistance Ron decreases.

Figure 7B:
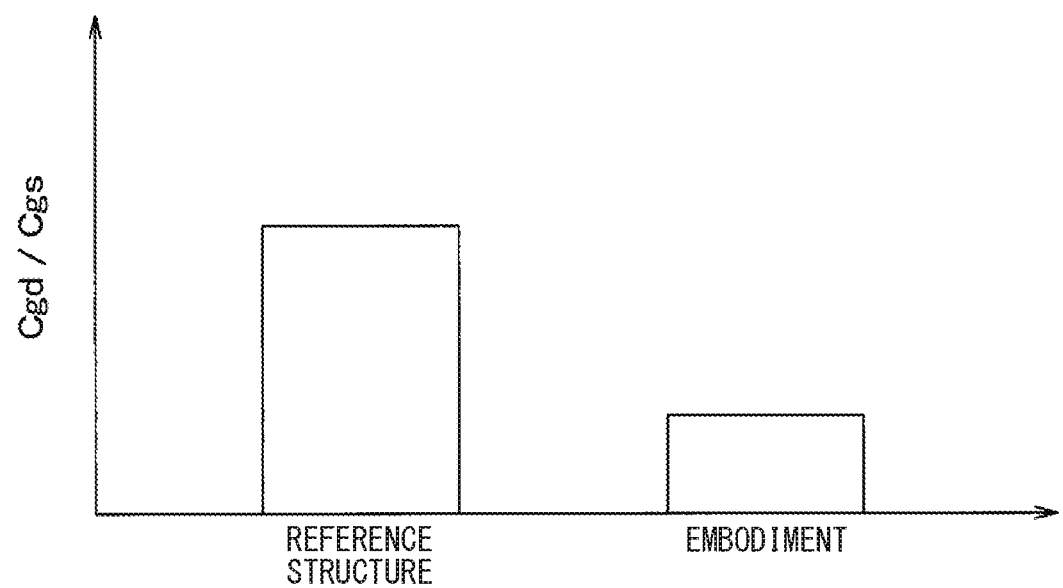
FIG. 7B is a diagram showing an investigation result of a relation of gate-drain capacitance Cgd/gate-source capacitance Cgs.

However, the gate-drain capacitance Cgd of the semiconductor device according to the present embodiment is smaller than that of the semiconductor device having the reference structure when the values of the on-resistance Ron of each of the semiconductor devices are same. This means that it may be possible to improve the trade-off relation between the on-resistance Ron and the gate-drain capacitance Cgd. As shown in FIG. 7B, the value of Cgd/Cgs of the semiconductor device according to the present embodiment is smaller than that of the semiconductor device having the reference structure. It may be possible to reduce the value of Crss/Ciss. Accordingly, it may be possible to shorten the term (2) described above, and further improve the switching characteristics.

Further, the SiC semiconductor device of this embodiment includes the JFET portion 3 and the electric field blocking layer 4. Therefore, when the vertical MOSFET is operated, the JFET portion 3 and the electric field blocking layer 4 function as the saturation current suppression layer, and the low on-state resistance can be provided by the saturation current suppression effect and the low saturation current can be maintained. Specifically, since the stripe shaped portion of the JFET portion 3 and the electric field blocking layer 4 are alternately and repeatedly formed, the following operation is performed.

First, when the drain voltage Vd is a voltage to be applied during normal operation such as 1 to 1.5 V, for example, a depletion layer extends from a side of the electric field blocking layer 4 to the JFET portion 3 and a width of the depletion layer is smaller than the width of the stripe shaped portion in the JFET portion 3. Therefore, even when the depletion layer extends into the JFET portion 3, it may be possible to secure a current path. Since the n type impurity concentration of the JFET portion 3 is higher than that of the n⁻ type layer 2 and the current path can be configured with a low resistance, it may be possible to provide the low on-state resistance.

Further, when the drain voltage Vd becomes higher than the voltage during normal operation due to a load short circuit or the like, the depletion layer extending from the side of the electric field blocking layer 4 to the JFET portion 3 extends more than the width of the stripe shaped portion of the JFET portion 3. Then, the JFET portion 3 is immediately pinched off before the n type current dispersion layer 5 is pinched off. Then, the relation between the drain voltage Vd and the width of the depletion layer is determined based on the width of the stripe shaped portion of the JFET portion 3 and the n type impurity concentration. Therefore, the width of the stripe shaped portion and the n type impurity concentration of the JFET portion 3 are set so that the JFET portion 3 is pinched off when the voltage becomes slightly higher than the drain voltage Vd in the normal operation. Accordingly, it may be possible to pinch off the JFET portion 3 even when the drain voltage Vd is low. In such a manner, when the drain voltage Vd becomes higher than the voltage in the normal operation, the JFET portion 3 is immediately pinched off. Thereby, it may be possible to maintain the low saturation current, and further improve a tolerance of the SiC semiconductor device due to the load short circuit or the like.

In such a manner, the JFET portion 3 and the electric field blocking layer 4 function as the saturation current suppression layer, and provide the saturation current suppression effect. Therefore, furthermore, it may be possible to provide the SiC semiconductor device capable of providing both of the low on-state resistance and the low saturation current.

Further, due to the configuration of the electric field blocking layer 4 so as to sandwich the JFET portion 3, the stripe shaped portion of the JFET portion 3 and the electric field block layer 4 are alternately and repeatedly formed. Therefore, even when the drain voltage Vd becomes a high voltage, the extension of the depletion layer extending from the bottom to the n⁻ type layer 2 is suppressed by the electric field blocking layer 4. Thereby, it may be possible to prevent the depletion layer from extending into the trench gate structure. Therefore, the electric field suppression effect that lowers the electric field applied to the gate insulation film 12 can be provided, and the gate insulation film 12 can be prevented from being broken. Therefore, it may be possible to obtain a highly reliable element with high breakdown strength. Since the depletion layer can be prevented from extending to the trench gate structure in this way, it may be possible to set that the n type impurity concentration of the n⁻ type layer 2 or the JFET portion 3 configuring a portion of the drift layer is relatively high. It may be possible to achieve a low on-state resistance.

As described above, in the present embodiment, the n type current dispersion layer 5 is not formed for all the trench gate structure, and the numeral number of n type current dispersion layers 5 is set to be lower than that of trench gate structures. Therefore, it may be possible to provide a configuration in which the portion configuring the gate-drain capacitance Cgd in the trench gate structure is only the portion contacted to the n type current dispersion layer 5. It may be possible to reduce the gate-drain capacitance Cgd. Since the present embodiment includes the portion in which the trench gate structure is formed and the n type current dispersion layer 5 is not formed, the gate-source capacitance Cgs is constant. Therefore, it may be possible to reduce the value of Cgd/Cgs.

It may be possible to provide the semiconductor device capable of improving the trade-off relation between the on-resistance Ron and the gate-drain capacitance Cgd while improving the switching characteristics.

Next, a method of manufacturing the SiC semiconductor device having the inverted vertical MOSFET having n channel type with the trench gate structure according to the present embodiment will be described with reference to cross-sectional views during the manufacturing process shown in FIGS. 8A and 8G.

Figure 8A:
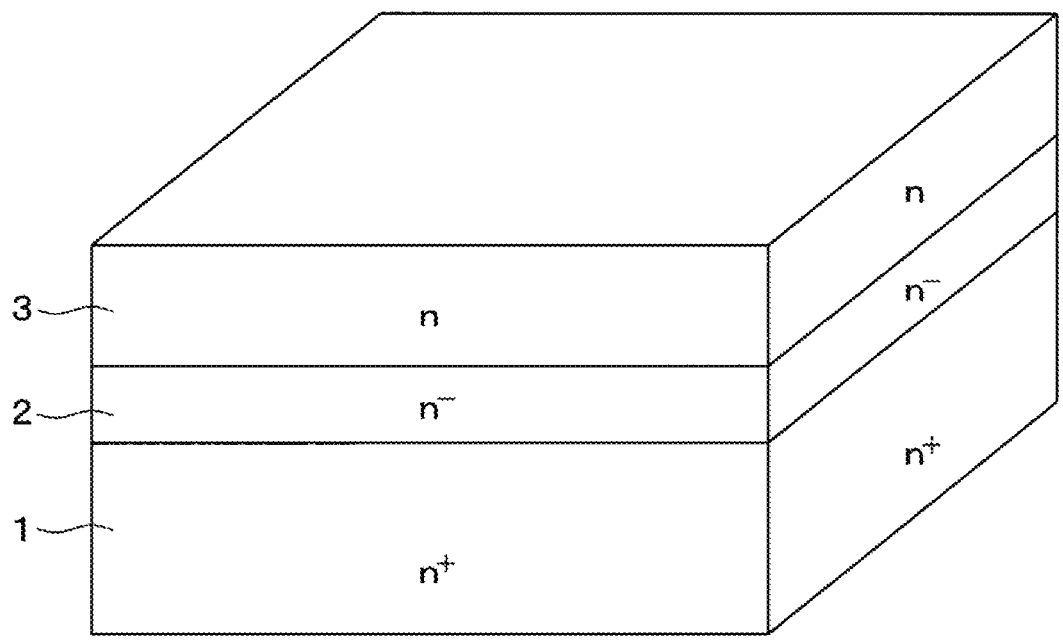
FIG. 8A is a perspective cross-sectional view illustrating a manufacturing process of the SiC semiconductor device shown in FIG. 1.

Process shown in FIG. 8A

First, the $n^+$ type substrate 1 is prepared as a semiconductor substrate. The $n^-$ type layer 2 made of SiC is formed on the main surface of the $n^+$ type substrate 1 by epitaxial growth using a CVD (chemical vapor deposition) apparatus (not shown). Then, a so-called epitaxial substrate in which the $n^-$ type layer 2 is preliminarily grown on the main surface of the $n^+$ type substrate 1 may be used. The JFET portion 3 made of SiC is epitaxially grown on the $n^-$ type layer 2.

The epitaxial growth is performed by introducing a gas serving as an n type dopant, for example, nitrogen gas in addition to silane or propane that is a raw material gas of SiC.

Figure 8B:
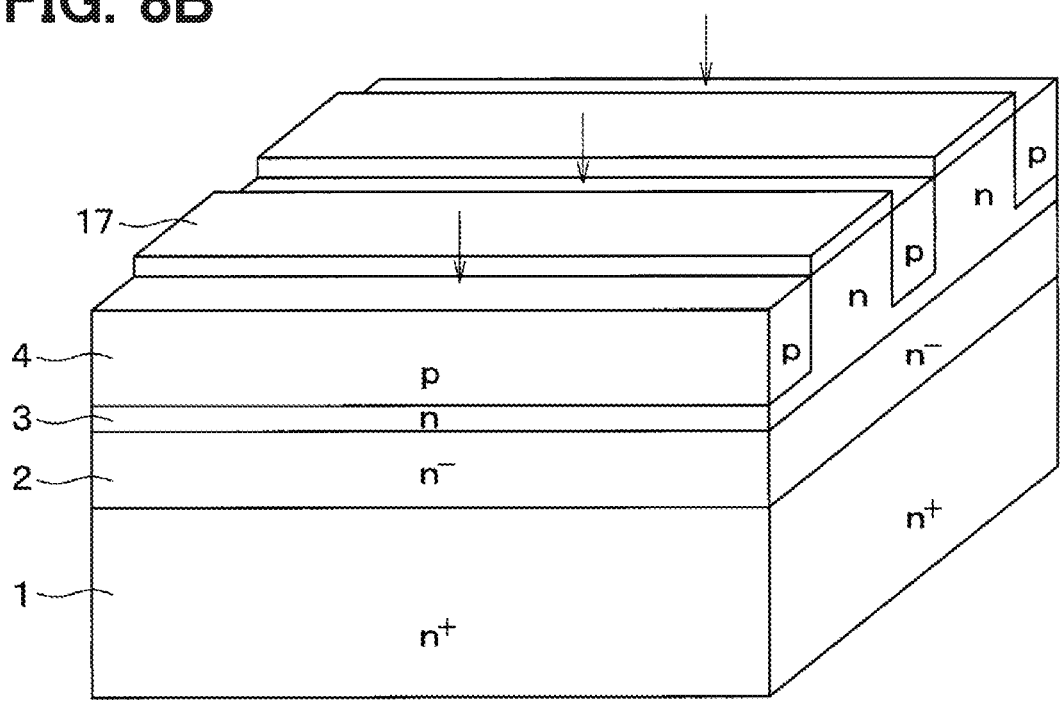
FIG. 8B is a perspective cross-sectional view illustrating a manufacturing process of the SiC semiconductor device continued from FIG. 8A.

Process shown in FIG. 8B

After a mask 17 is arranged on the surface of the JFET portion 3, the mask 17 is patterned to open a region where the electric field blocking layer 4 is to be formed. The electric field blocking layer 4 is formed by the ion implantation of p type impurities. Thereafter, the mask 17 is removed.

Here, the electric field blocking layer 4 is formed by the ion implantation. Alternatively, the electric field blocking layer 4 may be formed by a method other than the ion implantation. For example, selectively, the JFET portion 3 is anisotropically etched to form a recess at a position in accordance with the electric field blocking layer 4. After a p type impurity layer is epitaxially grown thereon, the p type impurity layer is planarized at the portion over the JFET 3, so that the electric field blocking layer 4 is formed. In such a manner, the electric field blocking layer 4 can also be formed by the epitaxial growth. When the p type SiC is epitaxially grown, a gas serving as a p type dopant, for example, trimethylaluminum (TMA) may be introduced in addition to the SiC raw material gas.

Figure 8C:
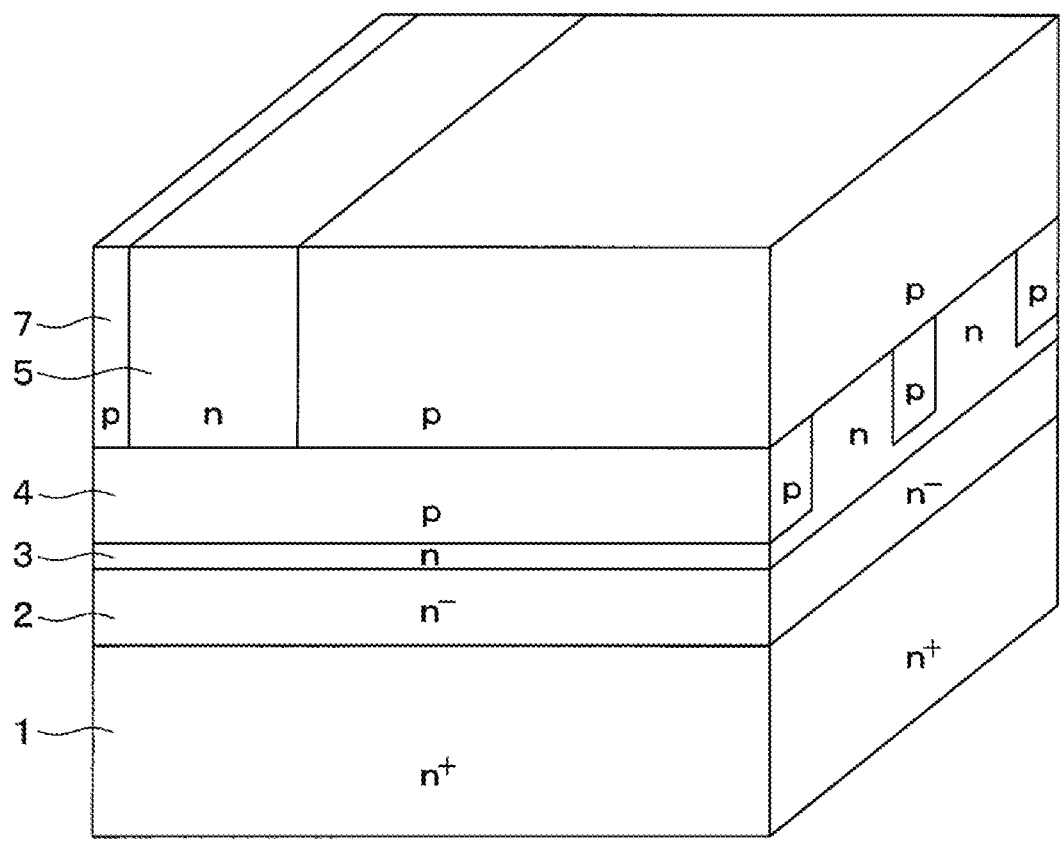
FIG. 8C is a perspective cross-sectional view illustrating a manufacturing process of the SiC semiconductor device continued from FIG. 8B.

Process shown in FIG. 8C

Subsequently, the n type SiC is epitaxially grown on the JFET portion 3 and the electric field blocking layer 4 to form the n type current dispersion layer 5. On the n type current dispersion layer 5, a mask (not shown) with an opening at a position where the p type deep layer 7 is to be formed is arranged. Thereafter, the p type deep layer 7 is formed by the ion implantation of the p type impurities from above the mask. Then, the numeral number of n type current distribution layer 5 is set to be smaller than that of trench gate structures formed in a later process. In a portion where the n type current dispersion layer 5 is not formed, the entire region of the trench gate structure is positioned in the p type deep layer 7.

Alternatively, though the example in which the p type deep layer 7 is formed by the ion implantation is described, the p type deep layer 7 may also be formed by methods other than the ion implantation. For example, similarly to the electric field blocking layer 4, a recess is formed for the n type current dispersion layer 5, and then the p type impurity layer is epitaxially grown and further the p type impurity layer is planarized, and thereby the p type deep layer 7 may be formed. Alternatively, the n type current dispersion layer 5 may be formed by the ion implantation after the p type deep layer 7 is formed.

Figure 8D:
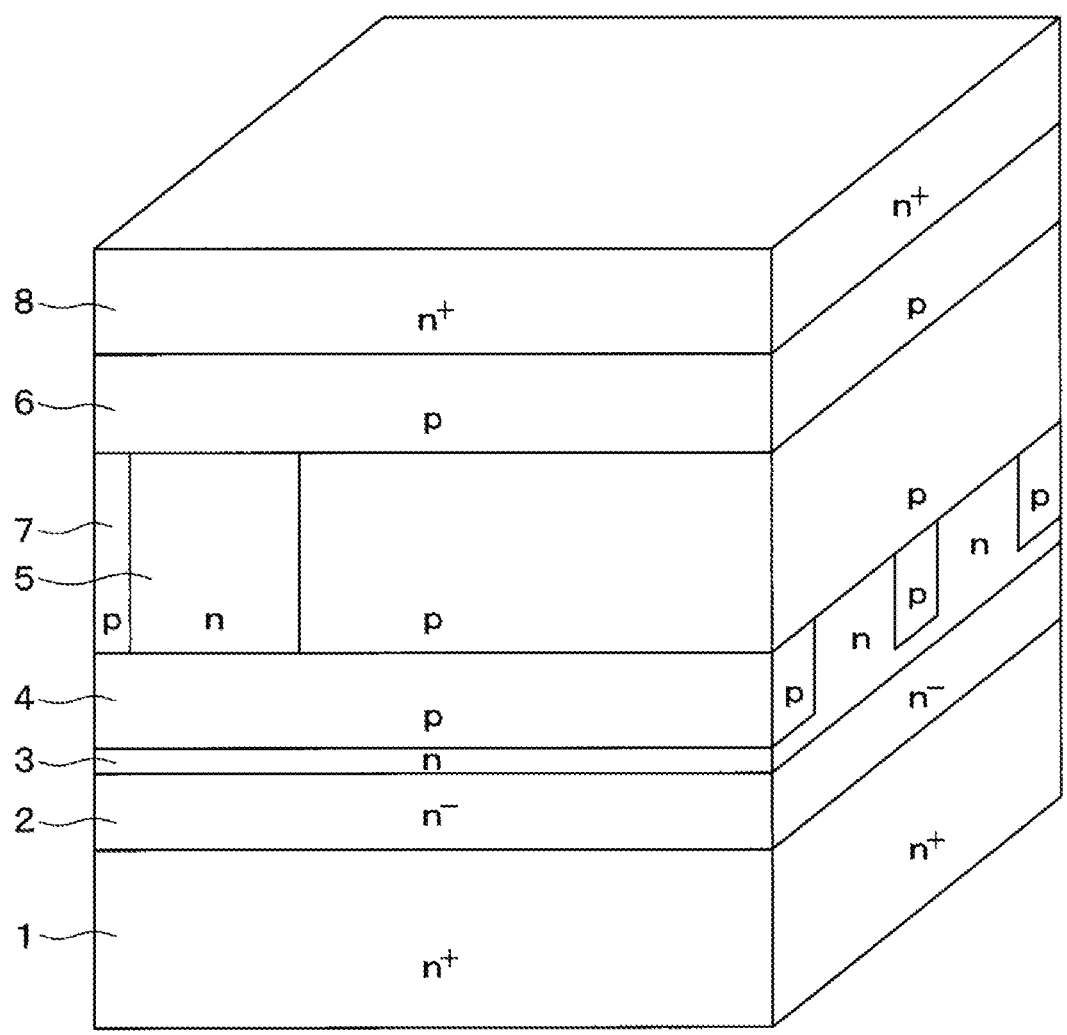
FIG. 8D is a perspective cross-sectional view illustrating a manufacturing process of the SiC semiconductor device continued from FIG. 8C.

Process shown in FIG. 8D

The p type base region 6 and the n type source region 8 are epitaxially grown in this order on the n type current dispersion layer 5 and the p type deep layer 7 by using the CVD apparatus (not shown). For example, in the same CVD apparatus, first, the p type deep layer 7 is formed by the epitaxial growth with introducing the gas serving as the p type dopant.

Subsequently, after the introduction of the gas for the p type dopant is stopped, the n type source region 8 is formed by the epitaxial growth with introducing the gas serving as the n type dopant.

In this way, the p type base region 6 and the n type source region 8 can be formed with the above-described impurity concentration and the film thickness.

Figure 8E:
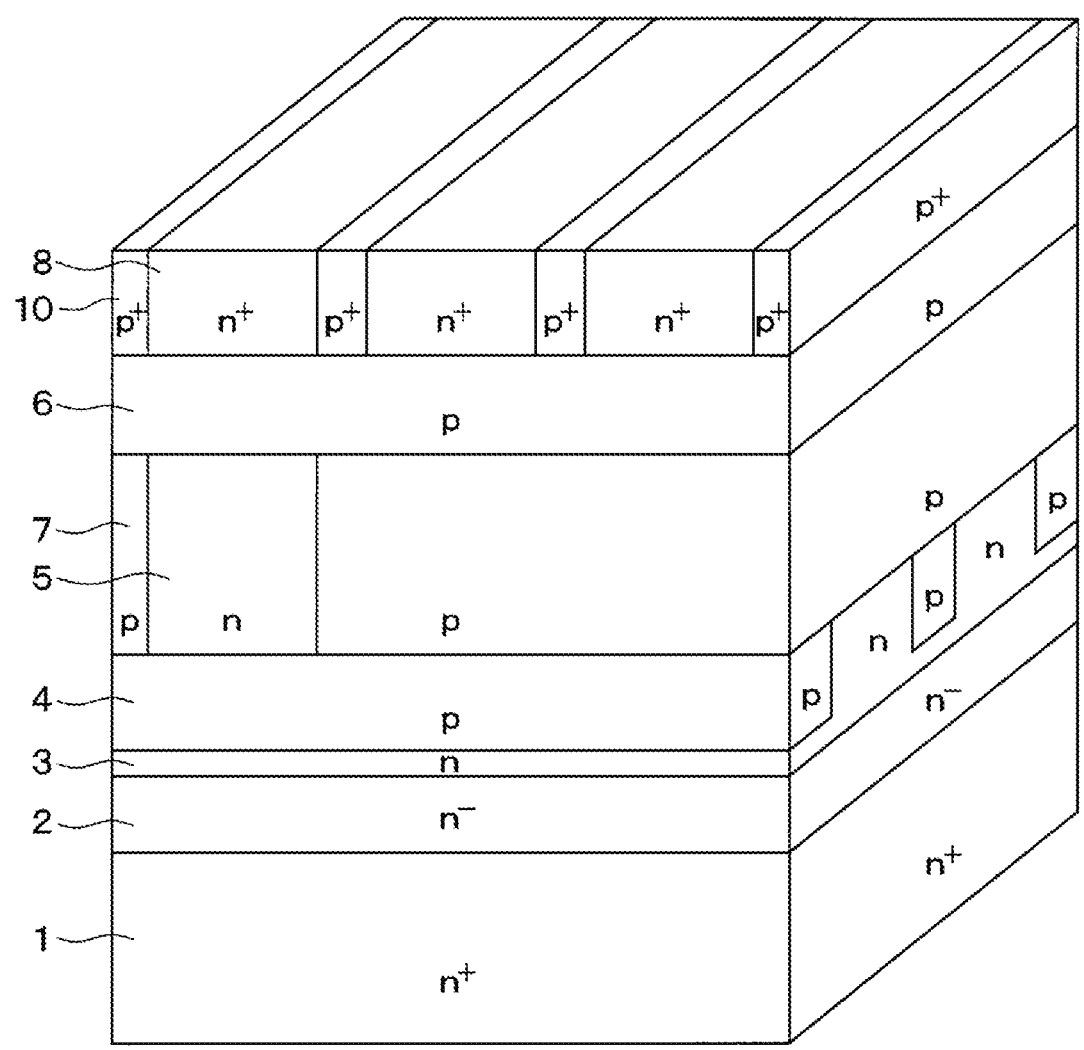
FIG. 8E is a perspective cross-sectional view illustrating a manufacturing process of the SiC semiconductor device continued from FIG. 8D.

Process shown in FIG. 8E

On the n type source region 8, a mask (not shown) with an opening at a position where the p type connection layer 10 is to be formed is disposed. Then, after the ion implantation of the p type impurities from above the mask, a heat treatment at 1500° C. or higher is performed for activation. As an element to be ion-implanted, one or both of boron (B) and aluminum (Al) are employed. Thereby, the p type connection layer 10 can be formed by cancelling the n type source region 8 by the ion implantation of the p type impurities.

Figure 8F:
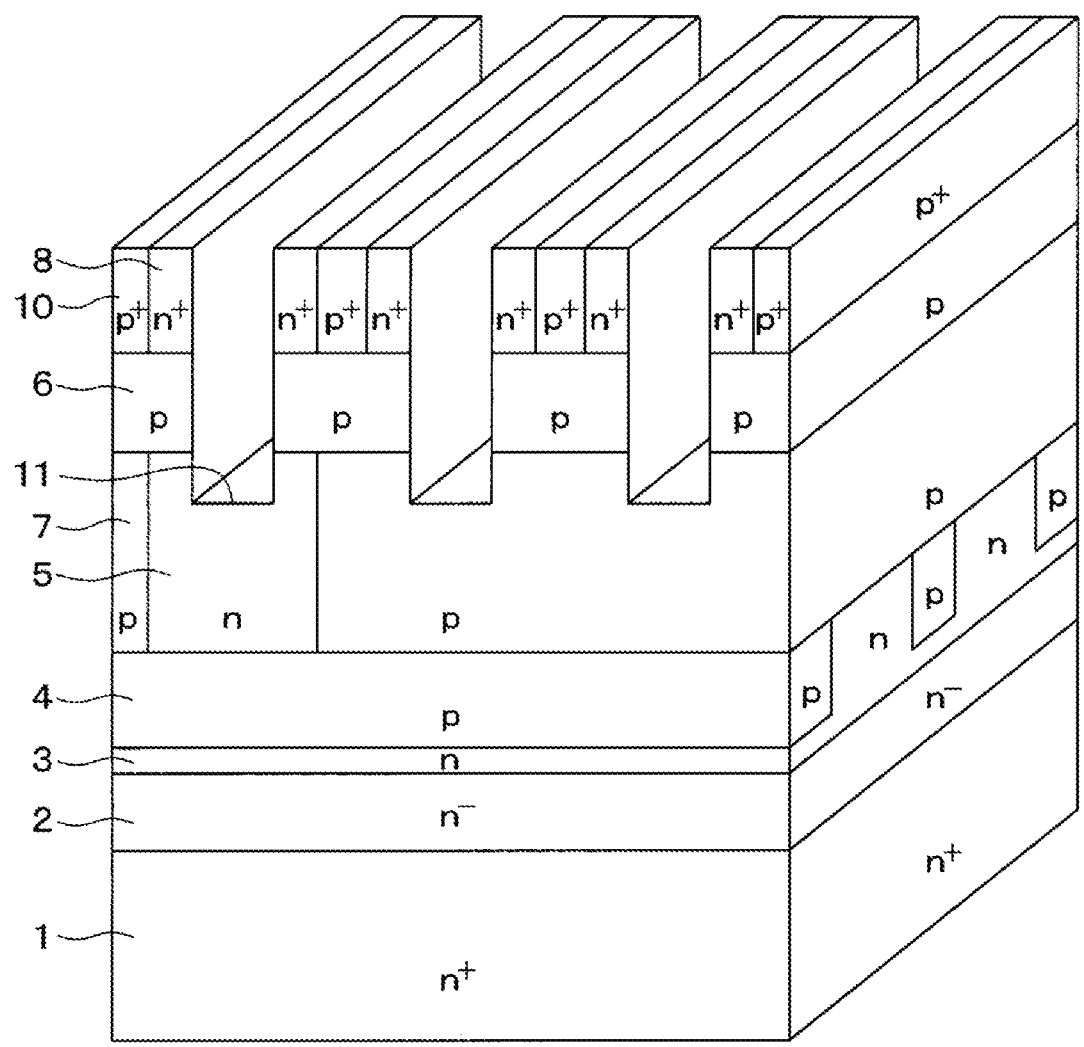
FIG. 8F is a perspective cross-sectional view illustrating a manufacturing process of the SiC semiconductor device continued from FIG. 8E.

Process shown in FIG. 8F

After a mask (not shown) is formed on the n type source region 8 or the like, a region of the mask where the gate trench 11 is to be formed is opened. The anisotropic etching such as RIE (reactive ion etching) is performed by using the mask, and thereby the gate trench 11 is formed.

Figure 8G:
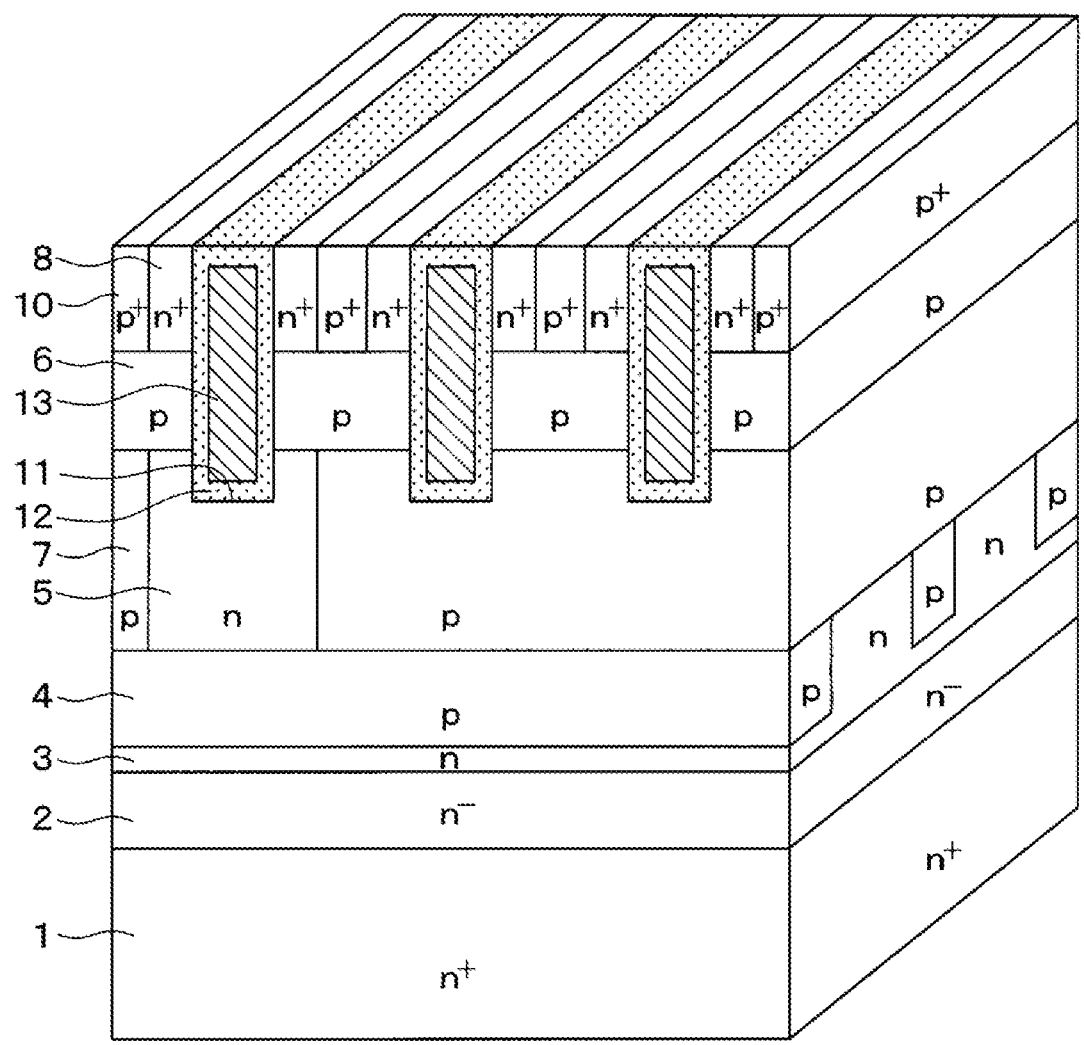
FIG. 8G is a perspective cross-sectional view illustrating a manufacturing process of the SiC semiconductor device continued from FIG. 8F.

Process shown in FIG. 8G

After the mask is removed, for example, the gate insulation film 12 is formed by performing thermal oxidation, so that the gate insulation film 12 covers the inner wall surface of the gate trench 11 and the surface of the n type source region 8. After Poly-Si doped with p type impurities or n type impurities is deposited, the Poly-Si is etched back. At least, the Poly-Si is remained in the gate trench 11, and thereby the gate electrode 13 is formed. Thereby, the trench gate structure is completed.

The subsequent processes are not shown. However, the following processes are performed. The interlayer insulation film 14 made of, for example, an oxide film or the like is formed to cover the surfaces of the gate electrode 13 and the gate insulation film 12. Further, a contact hole for exposing the n type source region 8 and the p type deep layer 7 is formed in the interlayer insulation film 14 by using a mask (not shown). After the electrode material comprised of, for example, the stacked structure made of multiple metals is formed on the surface of the interlayer insulation film 14, the source electrode 15 and a gate wiring layer are formed by patterning the electrode material. Further, the drain electrode 16 is formed on the back surface side of the $n^+$ type substrate 1. In this way, the SiC semiconductor device according to the present embodiment is completed.

Second Embodiment

Since the present embodiment is similar to the second embodiment except that the configuration of the electric field relaxation layer is changed as compared with the first embodiment, only portions different from the first embodiment will be described.

Figure 9:
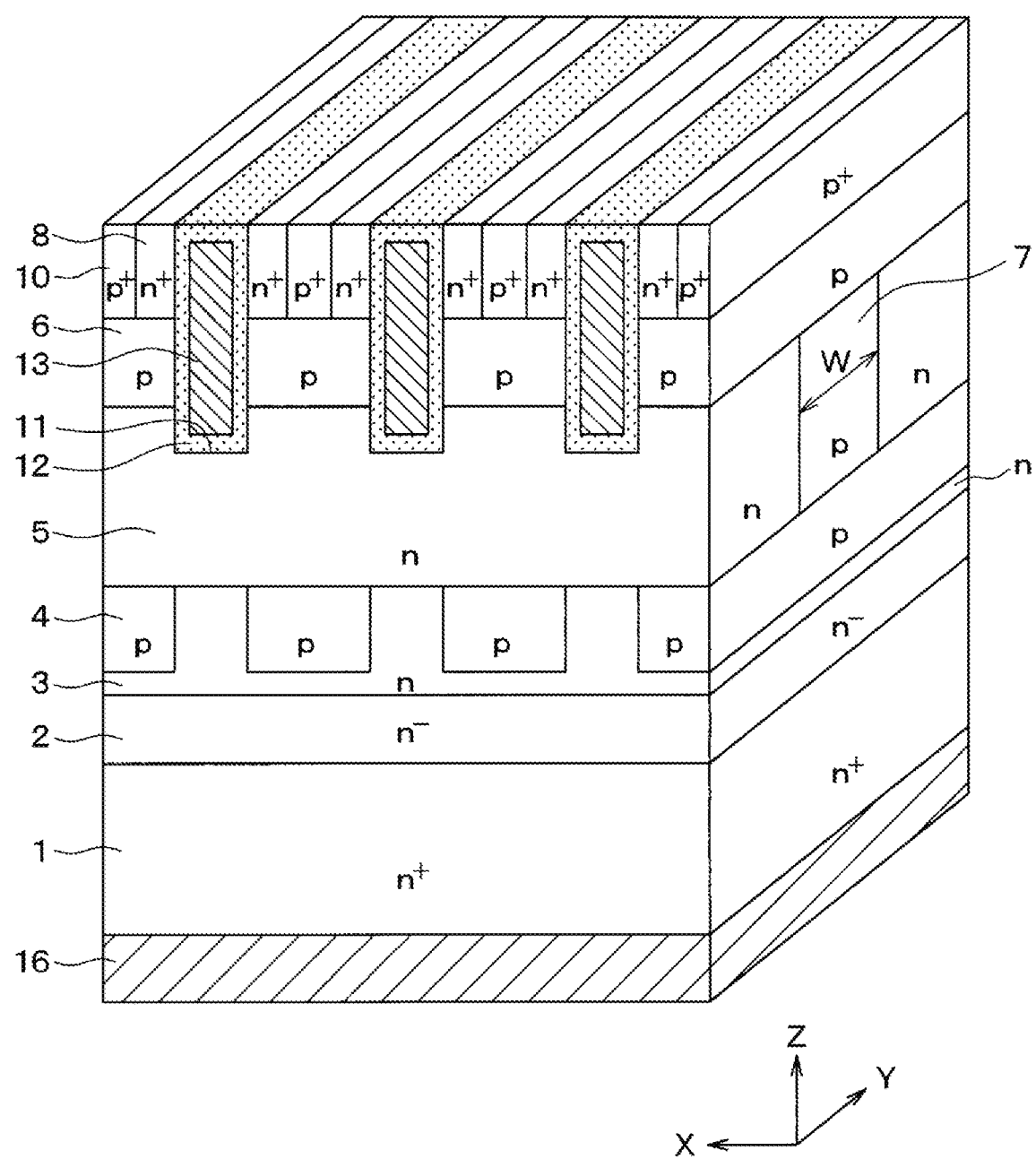
FIG. 9 is a perspective cross-sectional view illustrating a portion of an SiC semiconductor device according to a second embodiment.

As shown in FIG. 9, in the present embodiment, the longitudinal directions of the stripe shaped portion of the JFET portion 3 and the electric field blocking layer 4 are set to be similar to the longitudinal direction of the trench gate structure. The longitudinal direction of the p type deep layer 7 is set to a direction crossing the longitudinal of the trench gate structure or the electric field blocking layer 4, that is, set to a perpendicular direction here. The stripe shaped portion of the JFET portion 3 is formed so as to be positioned in accordance with the trench gate structure. The electric field blocking layers 4 are arranged at the both sides of the stripe shaped portion. The p type deep layer 7 is formed in the stripe shape with a predetermined width and a predetermined interval, and a drain current flows through the channel region in a portion where the p type deep layer 7 is not formed.

Even in such a configuration, a portion that does not function as the channel is partially formed in the region where the p type deep layer 7 is formed. That is, each trench gate structure can be configured to be partially connected to the n type current dispersion layer 5, and the bottom of the trench gate structure can be covered with the p type deep layer 7 in a portion not connected to the n-type current distribution layer 5. Accordingly, the similar effects as those of the first embodiment can be obtained. In the semiconductor device having such a structure, it may be possible to appropriately change the gate-drain capacitance Cgd to the desired value by adjusting a width W of the p type deep layer 7.

Third Embodiment

The present embodiment is the similar to the first and second embodiments except that the n type source region 8 is changed with respect to the first and second embodiments. Only the differences from the first and second embodiments will be described.

Figure 10:
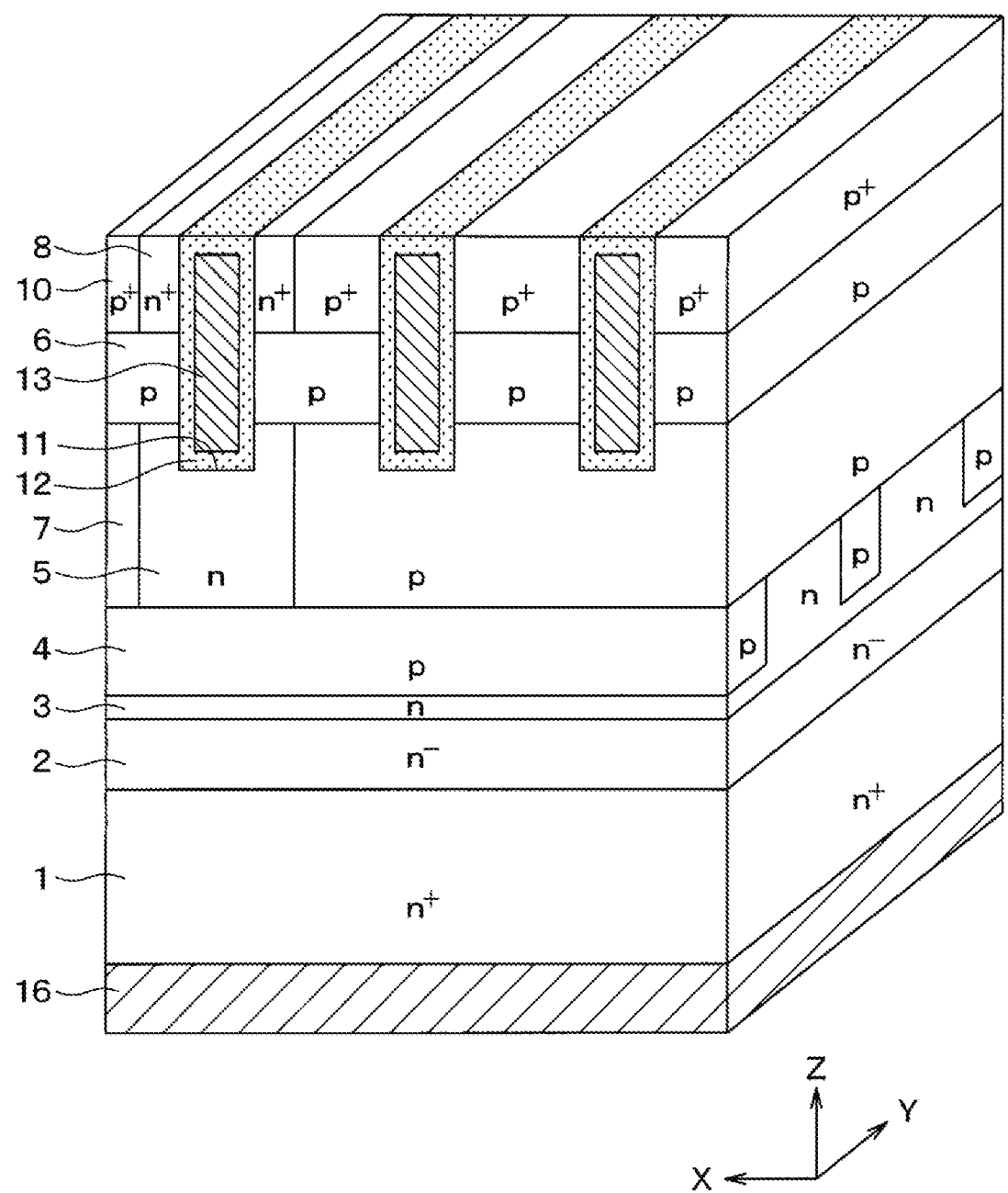
FIG. 10 is a perspective cross-sectional view illustrating a portion of an SiC semiconductor device according to a third embodiment.

As shown in FIG. 10, in the present embodiment, the n type source region 8 is formed only in a side surface of a portion contacted to the n type current dispersion layer 5 in the trench gate structure, that is, a portion that functions as the channel. The n type source region 8 is not formed in a side of a portion that is not contacted to the n type current dispersion layer 5 in the trench gate structure.

In such a manner, the n type source region 8 may be not formed in the portion other than the portion functioning as the channel in the trench gate structure. Due to the portion in which the n type source region 8 is not formed, it may be possible to increase the formation area of the p type connection layer 10. Therefore, it may be possible to provide a better contact with the p type connection layer 10. Accordingly, it may be easier to pull out the hole, and therefore it may be possible to further improve the switching characteristics.

For the semiconductor device configured described above, only a simple change of the mask layer, such as a change of the mask used when the p type connection layer 10 is formed after the n type source region 8 is formed, is necessary. The manufacturing process does not increase compared with the first and second embodiments.

Fourth Embodiment

Since the present embodiment is the similar to the first to third embodiments except that the configuration of the gate insulation film 12 is changed from the first to third embodiments, only portions different from the first to third embodiments will be described.

Figure 11:
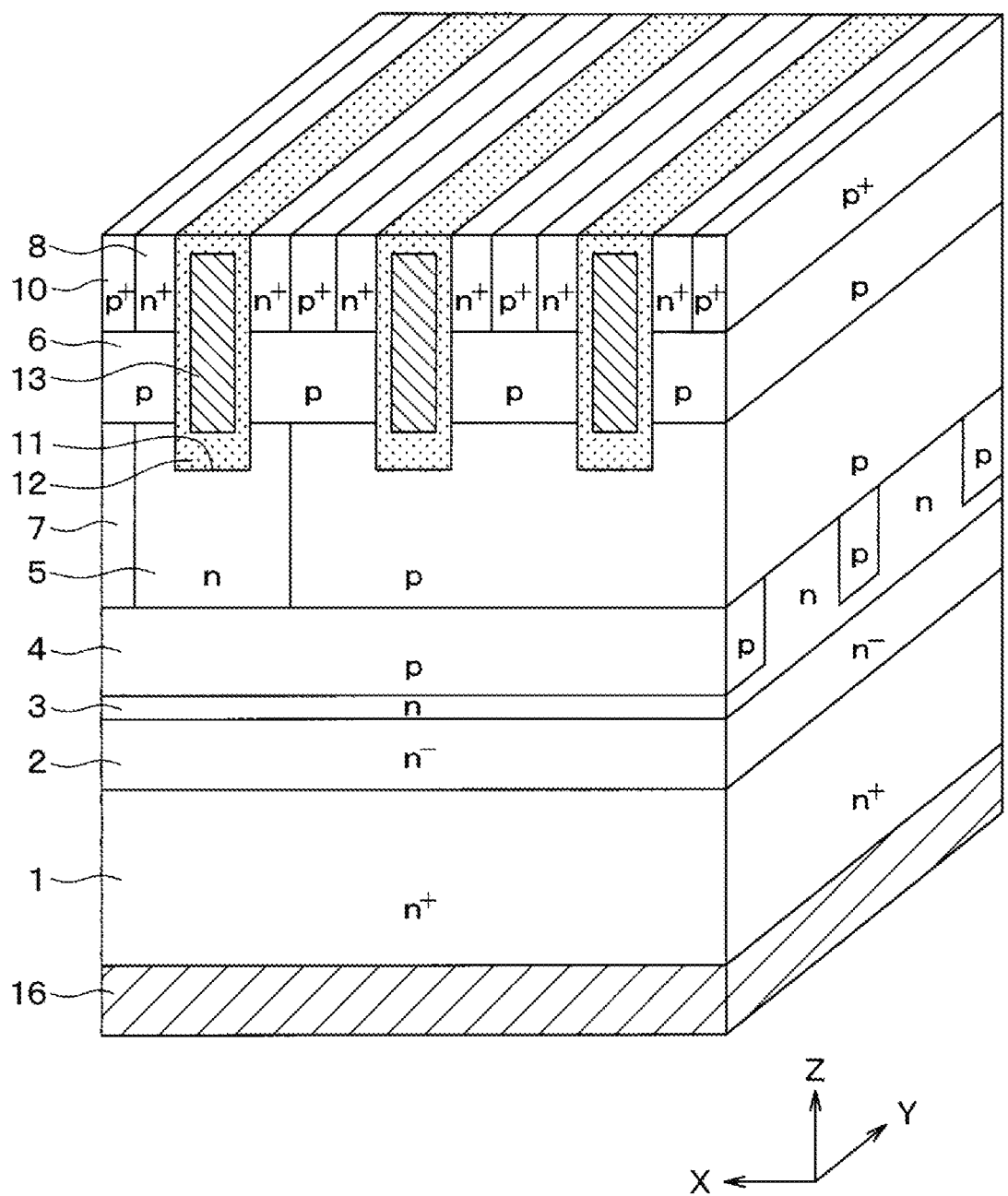
FIG. 11 is a perspective cross-sectional view illustrating a portion of an SiC semiconductor device according to a fourth embodiment.

As shown in FIG. 11, a thickness of the gate insulation film 12 in the bottom of the gate trench 11 is larger than that of the side surface portion. As described above, most of the gate-drain capacitance Cgd is configured of the capacitance of the portion for the bottom of the trench gate structure. However, this capacitance depends on the film thickness of the gate insulation film 12, and is smaller as the film thickness is larger.

Accordingly, as the present embodiment, the thickness of the gate insulation film 12 in the bottom of the gate trench 11 is set to be larger than that of the side surface portion, and thereby it may be possible to reduce the gate-drain capacitance Cgd. It may be possible to improve the trade-off relation between the on-resistance Ron and the gate-drain capacitance Cgd while further improving the switching characteristics.

Fifth Embodiment

A fifth embodiment will be described. Since the present embodiment is the similar to the first to third embodiments except that the vertical MOSFET has a planar structure instead of the trench gate structure from the first to fourth embodiments, only portions different from the first to third embodiments will be described. Here, the planar structure is applied to the vertical MOSFET having the structure according to the first embodiment. However, the planar structure may be appropriately applied to the vertical MOSFETs having the second to fourth embodiments.

Figure 12:
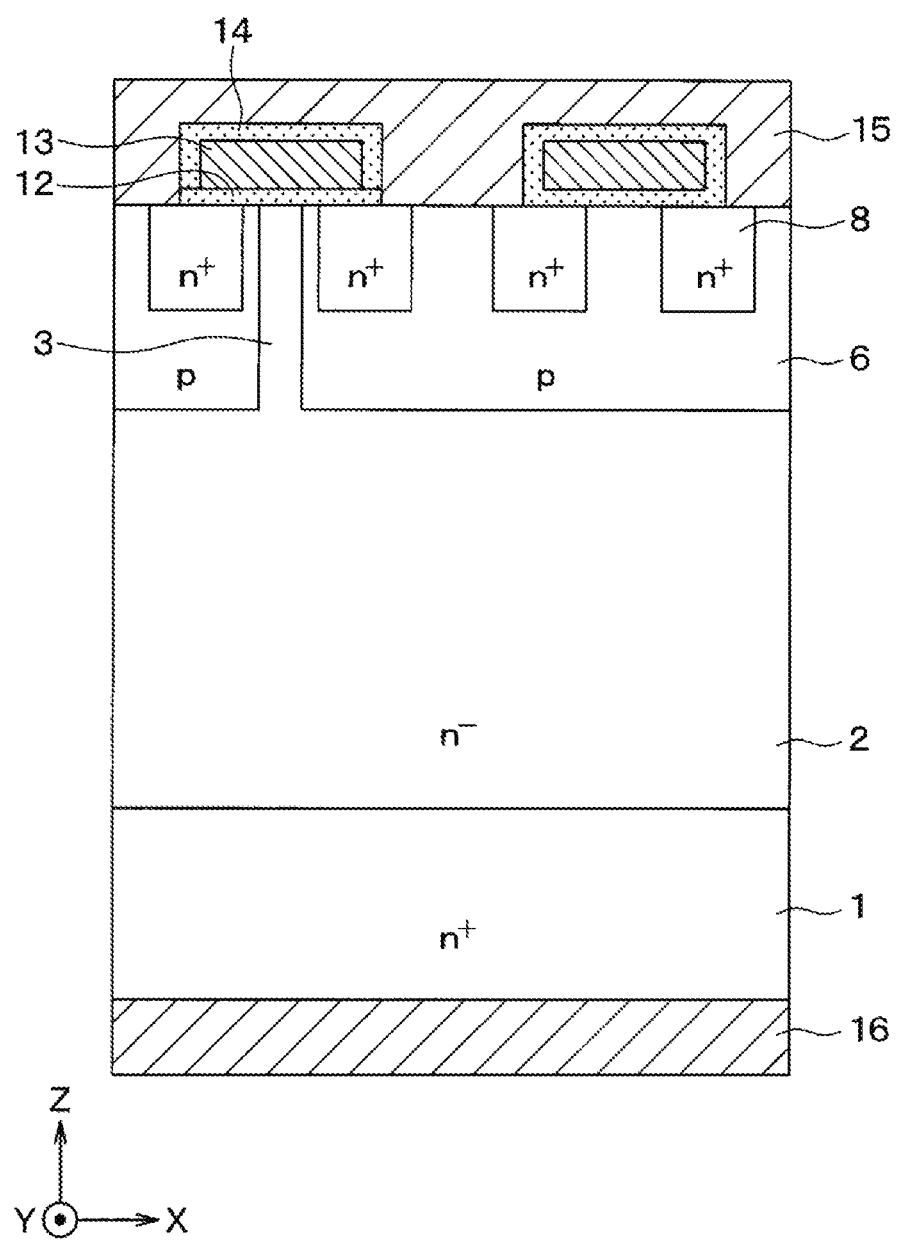
FIG. 12 is a cross-sectional view illustrating an SiC semiconductor device according to a fifth embodiment.

Specifically, even in a case of an SiC semiconductor device having the vertical MOSFET of the planar structure as shown in FIG. 12, it can be set that a portion of the gate structure can function as the channel, and the other portion cannot function as the channel. In a case of the planar structure, the p type base region 6 is formed on the n⁻ type layer 2, and the n type source region 8 is formed on a surface portion of the p type base region 6. The JFET portion 3 is formed so as to be sandwiched by the P type base regions 6. A portion positioned between the n type source region 8 and the JFET portion 3 in the p type base region 6 is formed as the channel region. The gate electrode 13 is formed on the channel region through the gate insulation film 12, and thereby the gate structure is configured. The gate structure extends in one direction along a paper perpendicular direction of FIG. 12, and the multiple gate structures are arranged in the stripe shape in the X direction.

Even in such a structure, the gate structure contacted to the JFET portion 3 is only a portion of the multiple gate structures, and the bottom of the remaining gate structure is contacted to only the p type base region 6 and the n type source region 8. The structure is covered with these. Thereby, it may be possible to provide a structure in which a portion of the gate structure functions as the channel and the remaining portion does not function as the channel. The similar effects with the first to fourth embodiments can be obtained. When the configuration in which the n type source region 8 is formed only for the gate structure functioning as the channel as the third embodiment is applied to the semiconductor device of the present disclosure, the bottom of the gate structure that does not function as the channel is contacted to only the p type base region 6.

Other Embodiments

The present disclosure is not limited to the embodiments described above and may be suitably modified.

(1) For example, the embodiments described above show the example that the numeral number of n type current dispersion layers 5 is one when the numeral number of trench gate structures is three. However, this is merely one example. That is, when the numeral number of trench gate structures are multiple, it may be necessary that the numeral number of n type current dispersion layers 5 or p type deep layers 7 is smaller than that of gate structures.

(2) In the first embodiment, the third embodiment, and the fourth embodiment described above, the longitudinal direction of the electric field blocking layer 4 corresponds to the direction crossing the longitudinal direction of the trench gate structure. However, the longitudinal direction of the electric field blocking layer 4 may correspond to the similar direction to the longitudinal direction of the trench gate structure. In this case, similarly to the second embodiment, each electric field blocking layer 4 is arranged at a position in accordance with a position between the trench gate structures adjacent to each other.

(3) The examples of various dimensions such as impurity concentration, thickness, width, and the like of each part constituting the SiC semiconductor device shown in the embodiments described above are merely examples.

(4) In the embodiments described above, the p type deep layer 7 and the p type connection layer 10 are separately configured. However, these may be made of the same p type deep layer. For example, a deep trench that reaches the electric field blocking layer 4 from the surface of the n type source region 8 through the p type base region 6 and the n type current dispersion layer 5 is formed, and the p type layer is formed so as to be embedded in the deep trench. In this way, it may be possible to configure the p type deep layer 7 and the p type connection layer 10 by the p type layer.

(5) In the embodiments described above, the n channel type vertical MOSFET in which the first conductivity type is n type and the second conductivity type is p type is described as an example. Alternatively, the conductivity type of each element may be reversed so as to form a p channel type vertical MOSFET. In the above description, the vertical MOSFET is described as an example of the semiconductor element. Alternatively, the present disclosure may also be applied to an IGBT having a similar structure. In the case of an n-channel type IGBT, only the conductivity type of the n+ type substrate 1 is changed from the n type to the p type with respect to the embodiments described above, and other structures and manufacturing methods are the similar to those in the embodiments described above.

(6) Although the semiconductor device using SiC as a semiconductor material is described in the embodiments described above, the present disclosure may be also applied to a semiconductor device using a semiconductor material other than SiC, for example, Si, GaN, or the like.

The reference number "3" corresponds to a JFET portion.

The reference number "4" corresponds to an electric field blocking layer.

The reference number "5" corresponds to an n type current dispersion layer.

The reference number "6" corresponds to a p type base region.

The reference number "7" corresponds to a p type deep layer.

The reference number "8" corresponds to an n type source region.

The reference number "10" corresponds to a p type connection layer.

The reference number "11" corresponds to a gate trench.

The reference number "13" corresponds to a gate electrode.

The invention claimed is:
1. A semiconductor device comprising:
an inversion type semiconductor element that includes:
 a semiconductor substrate that has a first conductive type or a second conductive type;
 a first conductive type layer that
  is formed on the semiconductor substrate, and
  is made of a semiconductor having the first conductive type and an impurity concentration lower than an impurity concentration of the semiconductor substrate;
 an electric field blocking layer that
  is formed on the first conductive type layer, and
  is made of a semiconductor having the second conductive type and including at least a linear shaped portion when the electric field blocking layer is viewed from a normal direction of the semiconductor substrate;
 a JFET portion that
  is formed on the first conductive type layer, and
  is made of a semiconductor having the first conductive type and a linear shaped portion sandwiched by the electric field blocking layer when the JFET portion is viewed from the normal direction of the semiconductor substrate;
 a current dispersion layer that
  is formed on the electric field blocking layer and the JFET portion, and
  is made of a semiconductor having the first conductive type and an impurity concentration higher than the impurity concentration of the first conductive type layer;
 a deep layer that
  has the second conductive type,
  is formed on the electric field blocking layer and the JFET portion together with the current dispersion layer;
 a base region that
  is formed on the current dispersion layer and the deep layer, and
  is made of a semiconductor having the second conductive type;
 a source region that
  is formed on the base region, and
  is made of a semiconductor having the first conductive type and a first conductive type impurity concentration higher than a first conductive type impurity concentration of the first conductive type layer;
 a plurality of trench gate structures that
  include a gate trench formed deeper than the base region from a surface of the source region, a gate insulation film covering an inner wall of the gate trench, and a gate electrode placed on the gate insulation film, and
  are arranged in a stripe shape, wherein one direction corresponds to a longitudinal direction of the plurality of trench gate structures;
 an interlayer insulation film that
  covers the gate electrode and the gate insulation film, and
  includes a contact hole;
 a source electrode that is ohmic-contacted to the source region through the contact hole; and a drain electrode that is formed on a back surface side of the semiconductor substrate, wherein a numeral number of the current dispersion layer is lower than a numeral number of the plurality of trench gate structures, and at least a portion of a bottom of the plurality of trench gate structures is covered with the deep layer.

2. The semiconductor device according to claim 1, wherein both of a longitudinal direction of the current dispersion layer and a longitudinal direction of the deep layer correspond to a direction similar to the longitudinal direction of the plurality of trench gate structures, a part of the plurality of trench gate structures is connected with the current dispersion layer, and an entire region of a bottom of a remaining part of the plurality of trench gate structures is covered with the deep layer.

3. The semiconductor device according to claim 2, wherein a formation pitch of the current dispersion layer is larger than a formation pitch of each of the plurality of trench gate structures, and a ratio of the numeral number of the current dispersion layer to the numeral number of the plurality of trench gate structures is set to a ratio of one to two or more.

4. The semiconductor device according to claim 2, wherein the plurality of trench gate structures include a first trench gate structure and a second trench gate structure, the source region is formed on a side surface of the first trench gate structure connected with the current dispersion layer, the source region is not formed on a side surface of the second trench gate structure, and an entire region of a bottom of the second trench gate structure is covered with the deep layer.

5. The semiconductor device according to claim 3, wherein the plurality of trench gate structures include a first trench gate structure and a second trench gate structure, the source region is formed on a side surface of the first trench gate structure connected with the current dispersion layer, the source region is not formed on a side surface of the second trench gate structure, and an entire region of a bottom of the second trench gate structure is covered with the deep layer.

6. The semiconductor device according to claim 1, wherein a first portion of the gate insulation film in accordance with the bottom of the plurality of trench gate structures is thicker than a second portion of the gate insulation film in accordance with a side wall portion of the plurality of trench gate structures.

7. The semiconductor device according to claim 1, wherein the plurality of trench gate structures are arranged along a direction crossing the one direction to form the stripe shape.

* * * * *